US012765127B2

(12) United States Patent
Song et al.

(10) Patent No.: US 12,765,127 B2
(45) Date of Patent: Oct. 13, 2026

(54) DISPLAY DEVICE

(71) Applicant: Samsung Display Co., LTD., Yongin-si (KR)

(72) Inventors: Myeong Hun Song, Yongin-si (KR); Jang Soon Park, Yongin-si (KR); Sung Geun Bae, Yongin-si (KR); Tae Hee Lee, Yongin-si (KR); Hyun Wook Lee, Yongin-si (KR); Kwang Taek Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 18/468,468

(22) Filed: Sep. 15, 2023

(65) Prior Publication Data

US 2024/0097074 A1 Mar. 21, 2024

(30) Foreign Application Priority Data

Sep. 19, 2022 (KR) ........................ 10-2022-0117964

(51) Int. Cl.
*H10H 20/831* (2025.01)
*H10W 90/00* (2026.01)

(52) U.S. Cl.
CPC .......... *H10H 20/831* (2025.01); *H10W 90/00* (2026.01)

(58) Field of Classification Search
CPC .... H10H 20/831; H10H 20/857; H10H 20/01; H10H 20/83; H10H 29/142; H10W 90/00; H01L 25/0753; H10D 86/441
See application file for complete search history.

(56) References Cited

U.S. PATENT DOCUMENTS

| | | | |
|---|---|---|---|
| 11,387,223 | B2 | 7/2022 | Woo et al. |
| 11,894,414 | B2 | 2/2024 | Kwak et al. |
| 2021/0376045 | A1 | 12/2021 | Lee et al. |
| 2022/0149244 | A1 | 5/2022 | Lee et al. |

(Continued)

FOREIGN PATENT DOCUMENTS

| | | | |
|---|---|---|---|
| KR | 10-2020-0118937 | A | 10/2020 |
| KR | 10-2021-0102560 | A | 8/2021 |
| KR | 10-2021-0132260 | A | 11/2021 |

(Continued)

*Primary Examiner* — Anne M Hines
*Assistant Examiner* — Jose M Diaz
(74) *Attorney, Agent, or Firm* — Womble Bond Dickinson (US) LLP

(57) ABSTRACT

A display device includes a substrate including an emission area and a non-emission area, alignment electrodes arranged to be spaced from each other in a first direction on the substrate and extending in a second direction crossing the first direction, and pixels arranged along the second direction. Pixels adjacent to each other in the second direction from among the pixels may be configured to emit light of different colors. Each of the pixels may include first light emitting elements on the alignment electrodes and arranged along the second direction, second light emitting elements on the alignment electrodes, spaced from the first light emitting elements in the first direction, and arranged along the second direction, a first pixel electrode electrically connected to a first driving power and first ends of the first light emitting elements, a second pixel electrode spaced from the first pixel electrode in the first direction.

20 Claims, 16 Drawing Sheets

(56) References Cited

U.S. PATENT DOCUMENTS

2023/0215980 A1* 7/2023 Kim .................... H10H 20/833
257/79

FOREIGN PATENT DOCUMENTS

KR 10-2021-0132278 A 11/2021
KR 10-2021-0148539 A 12/2021
KR 10-2022-0091703 A 7/2022

* cited by examiner

DISPLAY DEVICE

CROSS-REFERENCE TO RELATED APPLICATION

This application claims priority to and the benefit of Korean Patent Application No. 10-2022-0117964, filed on, Sep. 19, 2022, the entire content of which is incorporated by reference herein.

BACKGROUND

1. Field

The present disclosure relates to a display device.

2. Description of the Related Art

Recently, as interest in information display is increased, research and development of a display device are continuously being conducted.

SUMMARY

Aspects and features of embodiments of the present disclosure are to provide a pixel capable of preventing an electrical short of an electrode between series stages when a plurality of series stages is disposed in one pixel.

However, aspects and features of embodiments of the present disclosure are not limited to the above-described aspects and features, and may be variously expanded without departing from the spirit and scope of the present disclosure.

According to one or more embodiments of the present disclosure, a display device may include a substrate including an emission area and a non-emission area, alignment electrodes spaced from each other along a first direction on the substrate and extending in a second direction crossing the first direction, and pixels arranged along the second direction. Pixels adjacent to each other in the second direction from among the pixels may be configured to emit light of different colors. Each of the pixels may include first light emitting elements on the alignment electrodes and arranged along the second direction, second light emitting elements on the alignment electrodes, spaced from the first light emitting elements in the first direction, and arranged along the second direction, a first pixel electrode electrically connected to a first driving power and first ends of the first light emitting elements, a second pixel electrode spaced from the first pixel electrode in the first direction and electrically connected to a second driving power and second ends of the second light emitting elements, and a connection electrode electrically connecting the first pixel electrode and the second pixel electrode. The connection electrode may include a first connection electrode extending in the second direction between the first pixel electrode and the second pixel electrode and electrically connected to second ends of the first light emitting elements, and a second connection electrode extending in the second direction to face the first connection electrode with the second pixel electrode interposed therebetween and electrically connected to first ends of the second light emitting elements.

According to one or more embodiments, the display device may further include a third connection electrode connecting the first connection electrode and the second connection electrode, and extending in the first direction.

The first connection electrode, the second connection electrode, and the third connection electrode may be integrally formed.

According to one or more embodiments, the third connection electrode may overlap the non-emission area when viewed in a plan view.

According to one or more embodiments, the alignment electrodes may include a first alignment electrode, a second alignment electrode, and a third alignment electrode sequentially arranged along the first direction, the first light emitting elements may overlap the first alignment electrode and the second alignment electrode and located on the first alignment electrode and the second alignment electrode, and the second light emitting elements may overlap the second alignment electrode and the third alignment electrode and located on the second alignment electrode and the third alignment electrode.

According to one or more embodiments, the alignment electrodes may include a first alignment electrode, a second alignment electrode, a third alignment electrode, and a fourth alignment electrode sequentially arranged along the first direction, the first light emitting elements may overlap the first alignment electrode and the second alignment electrode and located on the first alignment electrode and the second alignment electrode, and the second light emitting elements may overlap the third alignment electrode and the fourth alignment electrode and located on the third alignment electrode and the fourth alignment electrode.

According to one or more embodiments, the pixels may include a first pixel, a second pixel, and a third pixel arranged along the second direction, the first pixel electrode may extend in the second direction in the emission area of each of the pixels, and a first pixel electrode in the first pixel may be spaced from a first pixel electrode in the second pixel and a first pixel electrode in the third pixel in the second direction.

According to one or more embodiments, the second pixel electrode may extend in the second direction in the emission area of each of the pixels, and a second pixel electrode included in the first pixel may be spaced from a second pixel electrode included in the second pixel and a second pixel electrode included in the third pixel in the second direction.

According to one or more embodiments, the second connection electrode may surround one area of the second pixel electrode.

According to one or more embodiments, the display device may further include third light emitting elements spaced from the first light emitting elements in the first direction and arranged along the second direction, and fourth light emitting elements spaced from the third light emitting elements in the first direction and arranged along the second direction. The second light emitting elements may be spaced in the first direction from the fourth light emitting elements.

According to one or more embodiments, the first connection electrode may include a first portion electrically connected to the second ends of the first light emitting elements, a third portion electrically connected to first ends of the second light emitting elements, and a second portion connecting the first portion and the third portion and extending in the first direction, and the first portion, the second portion, and the third portion may be integrally formed.

According to one or more embodiments, the second connection electrode may include a first portion electrically connected to second ends of the third light emitting elements, a third portion electrically connected to the first ends of the fourth light emitting elements, and a second portion connecting the first portion and the third portion and extending in the first direction, and the first portion, the second portion, and the third portion may be integrally formed.

According to one or more embodiments, the display device may further include an intermediate electrode between the first connection electrode and the second connection electrode and electrically connected to second ends of the second light emitting elements and first ends of the third light emitting elements.

According to one or more embodiments, the intermediate electrode may include a first intermediate electrode electrically connected to the second ends of the second light emitting elements, a third intermediate electrode electrically connected to the first ends of the third light emitting elements, and a second intermediate electrode connecting the first intermediate electrode and the third intermediate electrode and extending in the first direction, and the first intermediate electrode, the second intermediate electrode, and the third intermediate electrode may be integrally formed.

According to one or more embodiments, the second portion of the first connection electrode, the second portion of the second connection electrode, and the second intermediate electrode may overlap the non-emission area when viewed in a plan view.

According to one or more embodiments, the display device may further include a bank defining the emission area and the non-emission area, and the second portion of the first connection electrode, the second portion of the second connection electrode, and the second intermediate electrode may overlap the bank when viewed in a plan view.

According to one or more embodiments, the first connection electrode, the intermediate electrode, and the second connection electrode may be spaced from each other in the first direction, and the first intermediate electrode, the third portion of the first connection electrode, and the third intermediate electrode may be alternately arranged along the first direction.

According to one or more embodiments, a shape of the intermediate electrode may be symmetrical with a shape of the first connection electrode and a shape of the second connection electrode with respect to the first direction.

According to one or more embodiments, disposition directions of the first light emitting elements and the third light emitting elements may be the same, and a disposition direction of the second light emitting elements and the fourth light emitting element may be opposite to the disposition direction of the first light emitting elements and the third light emitting element.

According to one or more embodiments, the alignment electrodes may include a first alignment electrode, a second alignment electrode, a third alignment electrode, a fourth alignment electrode, and a fifth alignment electrode sequentially arranged along the first direction, the first light emitting elements may overlap the first alignment electrode and the second alignment electrode and are located on the first alignment electrode and the second alignment electrode, the second light emitting elements may overlap the second alignment electrode and the third alignment electrode and are located on the second alignment electrode and the third alignment electrode, the third light emitting elements may overlap the third alignment electrode and the fourth alignment electrode and are located on the third alignment electrode and the fourth alignment electrode, and the fourth light emitting elements may overlap the fourth alignment electrode and the fifth alignment electrode and are located on the fourth alignment electrode and the fifth alignment electrode.

According to one or more embodiments, the alignment electrodes may include a first alignment electrode, a second alignment electrode, a third alignment electrode, a fourth alignment electrode, a fifth alignment electrode, a sixth alignment electrode, a seventh alignment electrode, and an eighth alignment electrode sequentially arranged along the first direction, the first light emitting elements may overlap the first alignment electrode and the second alignment electrode and are located on the first alignment electrode and the second alignment electrode, the second light emitting elements may overlap the third alignment electrode and the fourth alignment electrode and are located on the third alignment electrode and the fourth alignment electrode, the third light emitting elements may overlap the fifth alignment electrode and the sixth alignment electrode and are located on the fifth alignment electrode and the sixth alignment electrode, and the fourth light emitting elements may overlap the seventh alignment electrode and the eighth alignment electrode and are located on the seventh alignment electrode and the eighth alignment electrode.

In accordance with a pixel and a display device including the same according to embodiments of the present disclosure, pixel electrodes for electrically connecting a plurality of series stages located in one direction in one pixel may cross each other with adjacent pixel electrodes. Therefore, process efficiency may be increased by securing a space margin in a manufacturing process.

In addition, because the pixel electrodes may be sequentially disposed in one direction, an electrical short that may occur when electrodes are disposed in various directions may be prevented.

However, effects, aspects, and features of the embodiments of the present disclosure are not limited to the above-described effects, aspects, and features and may be variously expanded without departing from the spirit and scope of the present disclosure.

BRIEF DESCRIPTION OF THE DRAWINGS

The above and other features of the present disclosure will become more apparent by describing in further detail embodiments thereof with reference to the accompanying drawings, in which.

DETAILED DESCRIPTION

Figure 1:
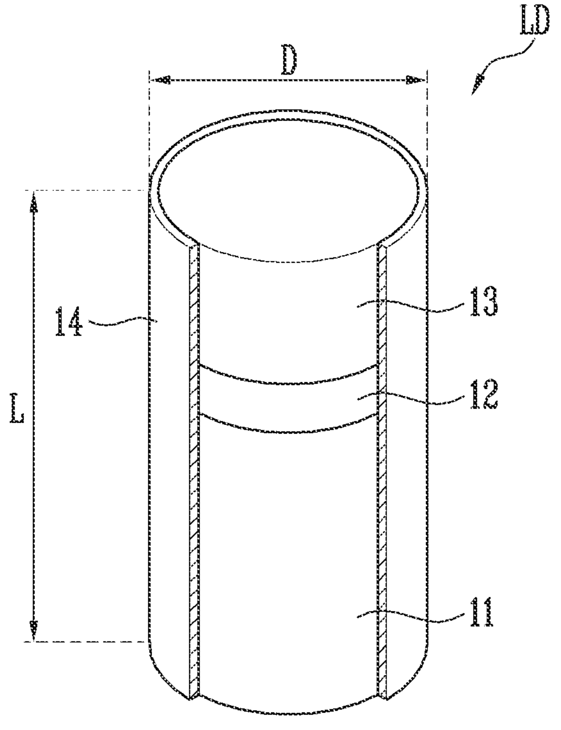
FIG. 1 is a perspective cutaway view schematically illustrating a light emitting element according to one or more embodiments of the present disclosure.

Hereinafter, one or more embodiments of the present disclosure are described in more detail with reference to the accompanying drawings. The same reference numerals are used for the same components in the drawings, and a repeated description of the same components is omitted.

Figure 2:
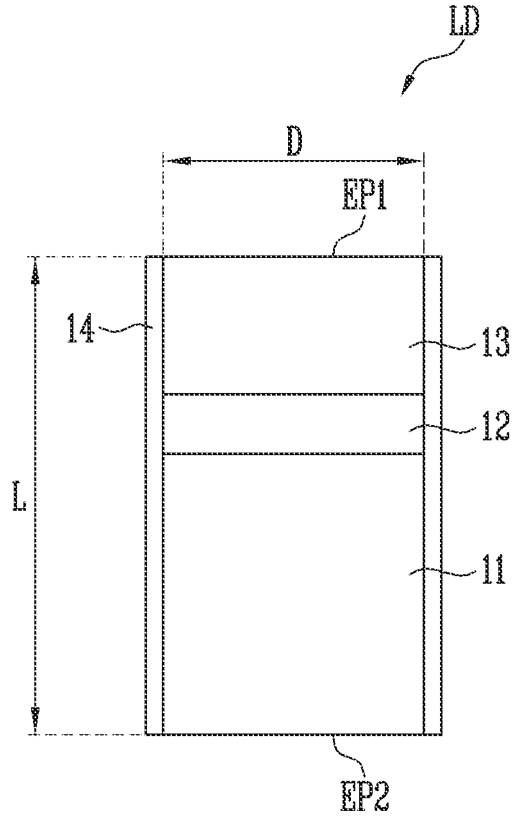
FIG. 2 is a cross-sectional view illustrating an example of the light emitting element of FIG. 1.

FIG. 1 is a perspective cutaway view schematically illustrating a light emitting element according to one or more embodiments of the present disclosure. FIG. 2 is a cross-sectional view illustrating an example of the light emitting element of FIG. 1.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may be implemented in a light emitting stack (or a stack pattern) in which the first semiconductor layer 11, the active layer 12, and the second semiconductor layer 13 are sequentially stacked.

In one or more embodiments, the light emitting element LD may be provided in a shape extending in one direction. When an extension direction of the light emitting element LD is referred to as a length direction, the light emitting element LD may include a first end EP1 and a second end EP2 along the length direction. One semiconductor layer of the first semiconductor layer 11 and the second semiconductor layer 13 may be positioned at the first end EP1 of the light emitting element LD, and the other semiconductor layer of the first semiconductor layer 11 and the second semiconductor layer 13 may be positioned at the second end EP2 of the light emitting element LD.

In one or more embodiments, the light emitting element LD may be provided in various shapes. For example, as shown in FIG. 1, the light emitting element LD may have a rod-like shape, a bar-like shape, or a column shape that is long in the length direction (or having an aspect ratio greater than 1). As another example, the light emitting element LD may have a rod-like shape, a bar-like shape, or a column shape that is short in the length direction (or having an aspect ratio of less than 1). As still another example, the light emitting element LD may have a rod-like shape, a bar-like shape, or a column shape having an aspect ratio of 1.

The light emitting element LD may include, for example, a light emitting diode (LED) manufactured to be extremely small to have a diameter D and/or a length L of about a nano scale (or nano meter) to a micro scale (or micro meter).

In one or more embodiments, when the light emitting element LD is long in the length direction (that is, the aspect ratio is greater than 1), the diameter D of the light emitting element LD may be about 0.5 μm to 6 μm, and the length L of the light emitting element LD may be about 1 μm to 10 μm. However, the diameter D and the length L of the light emitting element LD are not limited thereto. A size of the light emitting element LD may be changed to satisfy a requirement condition (or a design condition) of a lighting device or a self-emission display device to which the light emitting element LD is applied.

In one or more embodiments, the first semiconductor layer 11 may include, for example, at least one n-type semiconductor layer. The first semiconductor layer 11 may include an upper surface contacting the active layer 12 along the length direction of the light emitting element LD and a lower surface exposed to the outside. The lower surface of the first semiconductor layer 11 may be one end (or a lower end) of the light emitting element LD.

In one or more embodiments, the active layer 12 may be disposed on the first semiconductor layer 11 and may be formed in a single or multiple quantum well structure. For example, when the active layer 12 is formed in the multiple quantum well structure, in the active layer 12, a barrier layer, a strain reinforcing layer, and a well layer may be periodically and repeatedly stacked as one unit. The strain reinforcing layer may have a lattice constant less than that of the barrier layer to further reinforce a strain, for example, a compression strain, applied to the well layer. However, a structure of the active layer 12 is not limited to the above-described embodiment.

In one or more embodiments, the active layer 12 may emit light of a wavelength of about 400 nm to 900 nm, and may use a double hetero structure. The active layer 12 may include a first surface contacting the first semiconductor layer 11 and a second surface contacting the second semiconductor layer 13.

In one or more embodiments, a color (or an output light color) of the light emitting element LD may be determined according to the wavelength of the light emitted from the active layer 12. The color of the light emitting element LD may determine a color of a corresponding pixel. For example, the light emitting element LD may emit red light, green light, or blue light.

In one or more embodiments, when an electric field having a suitable voltage (e.g., a predetermined voltage) or more is applied between both ends of the light emitting element LD, the light emitting element LD emits light while electron-hole pairs are combined in the active layer 12. By controlling light emission of the light emitting element LD by using such a principle, the light emitting element LD may be used as a light source (or a light emitting source) of various light emitting devices including a pixel of the display device.

In one or more embodiments, the second semiconductor layer 13 may be disposed on the second surface of the active layer 12 and may include a semiconductor layer of a type different from that of the first semiconductor layer 11.

In one or more embodiments, the second semiconductor layer 13 may include a lower surface contacting the second surface of the active layer 12 along the length direction of the light emitting element LD and an upper surface exposed to the outside. Here, the upper surface of the second semiconductor layer 13 may be another end (or an upper end) of the light emitting element LD.

In one or more embodiments, the first semiconductor layer 11 and the second semiconductor layer 13 may have thicknesses different from each other in the length direction of the light emitting element LD. For example, the first semiconductor layer 11 may have a thickness relatively greater than that of the second semiconductor layer 13 along the length direction of the light emitting element LD. Therefore, the active layer 12 of the light emitting element LD may be positioned more adjacently to the upper surface of the second semiconductor layer 13 than to the lower surface of the first semiconductor layer 11.

In one or more embodiments, although the first semiconductor layer 11 and the second semiconductor layer 13 are shown as being configured of one layer, the present disclosure is not limited thereto. In one or more embodiments, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer for reducing a lattice constant difference. The TSBR layer may be configured of a p-type semiconductor layer such as p-GaInP, p-AlInP, and p-AlGaInP, but is not limited thereto.

In one or more embodiments, the light emitting element LD may further include a contact electrode (hereinafter referred to as a "first contact electrode") disposed on the second semiconductor layer 13 in addition to the above-described first semiconductor layer 11, active layer 12, and second semiconductor layer 13. In addition, according to another embodiment, the light emitting element LD may further include another contact electrode (hereinafter referred to as a "second contact electrode") disposed at one end of the first semiconductor layer 11.

In one or more embodiments, each of the first and second contact electrodes may be an ohmic contact electrode, but is not limited thereto. According to one or more embodiments, the first and second contact electrodes may be Schottky contact electrodes. The first and second contact electrodes may include a conductive material.

In one or more embodiments, the light emitting element LD may further include an insulating film 14 (or an insulating film). However, according to one or more embodiments, the insulating film 14 may be omitted and may be provided so as to cover only a portion of the first semiconductor layer 11, the active layer 12, and the second semiconductor layer 13.

In one or more embodiments, the insulating film 14 may prevent an electrical short that may occur when the active layer 12 contacts a conductive material other than the first and second semiconductor layers 11 and 13. In addition, the insulating film 14 may reduce or minimize a surface defect of the light emitting element LD to improve life and light emission efficiency of the light emitting element LD. When the active layer 12 may prevent occurrence of a short with an external conductive material, presence or absence of the insulating film 14 is not limited.

In one or more embodiments, the insulating film 14 may be around (e.g., may surround) at least a portion of an outer surface (e.g., an outer peripheral or circumferential surface) of the light emitting stack including the first semiconductor layer 11, the active layer 12, and the second semiconductor layer 13.

In the above-described embodiment, the insulating film 14 entirely surround the outer surface (e.g., the outer peripheral or circumferential surface) of each of the first semiconductor layer 11, the active layer 12, and the second semiconductor layer 13, but the present disclosure is not limited thereto.

In one or more embodiments, the insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($VxO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the present disclosure is not limited thereto, and various suitable materials having insulating properties may be used as the material of the insulating film 14.

In one or more embodiments, the insulating film 14 may be provided in a form of a single layer, or may be provided in a form of multiple layers including double layers.

The above-described light emitting element LD may be used as a light emitting source (or a light source) of various display devices. The light emitting element LD may be manufactured through a surface treatment process. For example, when a plurality of light emitting elements LD is mixed in a fluid solution (or solvent) and supplied to each pixel area (for example, an emission area of each pixel or an emission area of each sub-pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that require a light source, including a display device. For example, when a plurality of light emitting elements LD is disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

However, this is an example, and the light emitting element LD applied to the display device according to one or more embodiments of the present disclosure is not limited thereto. For example, the light emitting element may be a flip chip type of micro light emitting diode or an organic light emitting element including an organic light emitting layer.

Figure 3:
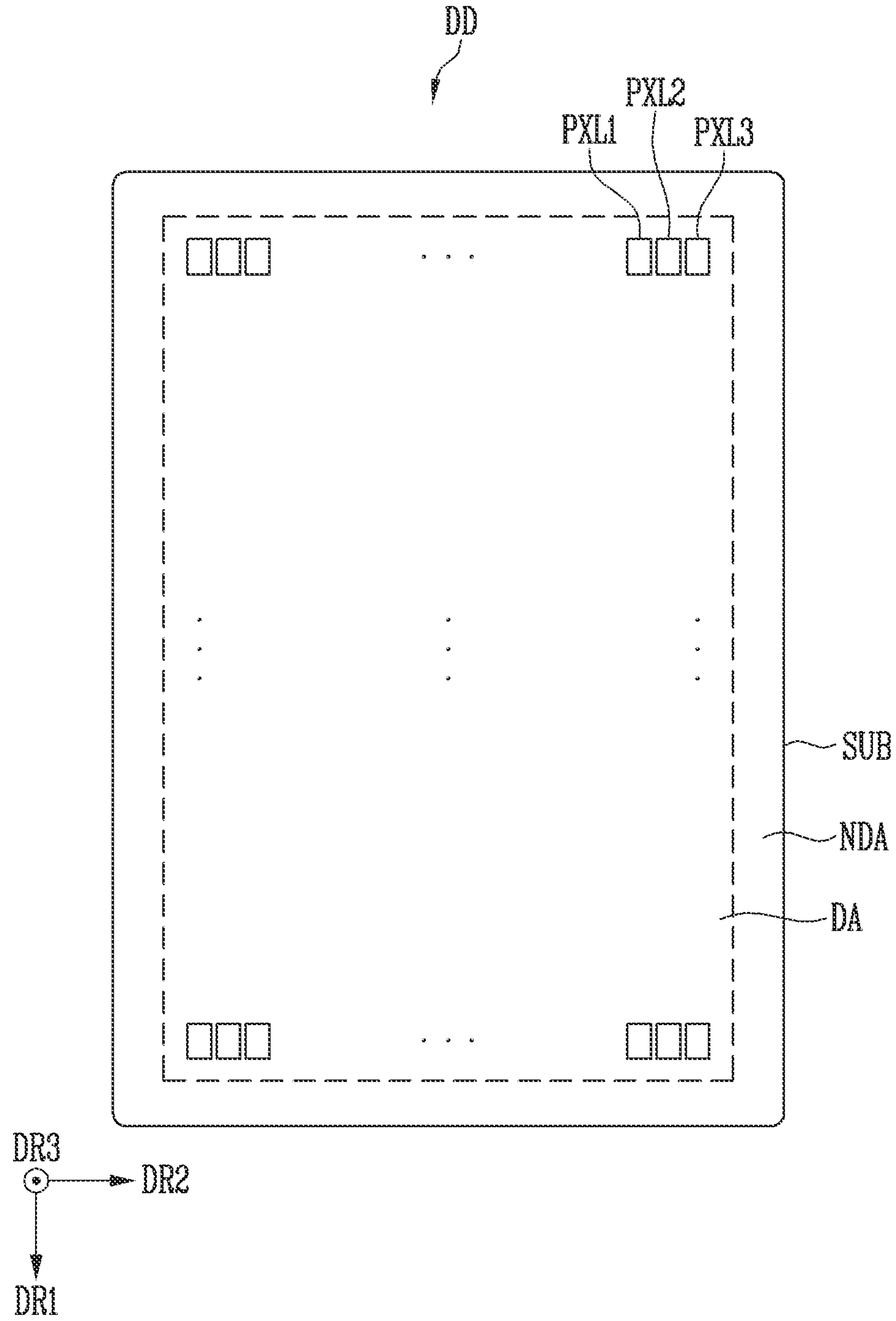
FIG. 3 is a schematic plan view illustrating a display device according to one or more embodiments of the present disclosure.

FIG. 3 is a schematic plan view illustrating a display device according to one or more embodiments of the present disclosure.

Referring to FIGS. 1, 2, and 3, the display device DD may include a substrate SUB, pixels PXL1, PXL2, and PXL3 provided on the substrate SUB and each including at least one light emitting element LD, a driver provided on the substrate SUB and driving the pixels PXL1, PXL2, and PXL3, and a line unit connecting the pixels PXL1, PXL2, and PXL3 and the driver.

In one or more embodiments, the substrate SUB may include a display area DA and a non-display area NDA around an edge or periphery of the display area DA.

In one or more embodiments, the display area DA may be an area where the pixels PXL1, PXL2, and PXL3 displaying an image are provided. The non-display area NDA may be an area in which the driver for driving the pixels PXL1, PXL2, and PXL3 and a portion of the line unit connecting the pixels PXL1, PXL2, and PXL3 and the driver are provided.

In one or more embodiments, the non-display area NDA may be positioned adjacent to the display area DA. The non-display area NDA may be provided on at least one side of the display area DA. For example, the non-display area NDA may be around (e.g., may surround) a periphery or circumference (or an edge) of the display area DA.

In one or more embodiments, the line unit may electrically connect the driver and the pixels PXL1, PXL2, and PXL3. The line unit may provide a signal to the pixels PXL1, PXL2, and PXL3 and may include a fan-out line connected to signal lines connected to each of the pixels PXL1, PXL2, and PXL3, for example, a scan line, a data line, an emission control line, and the like.

In one or more embodiments, the substrate SUB may include a transparent insulating material to transmit light. The substrate SUB may be a rigid substrate or a flexible substrate.

In one or more embodiments, the pixels PXL1, PXL2, and PXL3 may include a first pixel PXL1, a second pixel PXL2, and a third pixel PXL3. In one or more examples, the first pixel PXL1 may be a red pixel, the second pixel PXL2 may be a green pixel, and the third pixel PXL3 may be a blue pixel. However, the present disclosure is not limited thereto, and the pixels PXL1, PXL2, and PXL3 may emit light in colors other than red, green, and blue, respectively.

In one or more embodiments, the pixels PXL1, PXL2, and PXL3 may include at least one light emitting element LD driven by corresponding scan signal and data signal. The light emitting element LD may have a size as small as a nano scale (or nano meter) to a micro scale (or micro meter) and may be connected in parallel with adjacently disposed light emitting elements, but the present disclosure is not limited thereto. The light emitting element LD may configure a light source of each of the pixels PXL1, PXL2, and PXL3.

Figure 4:
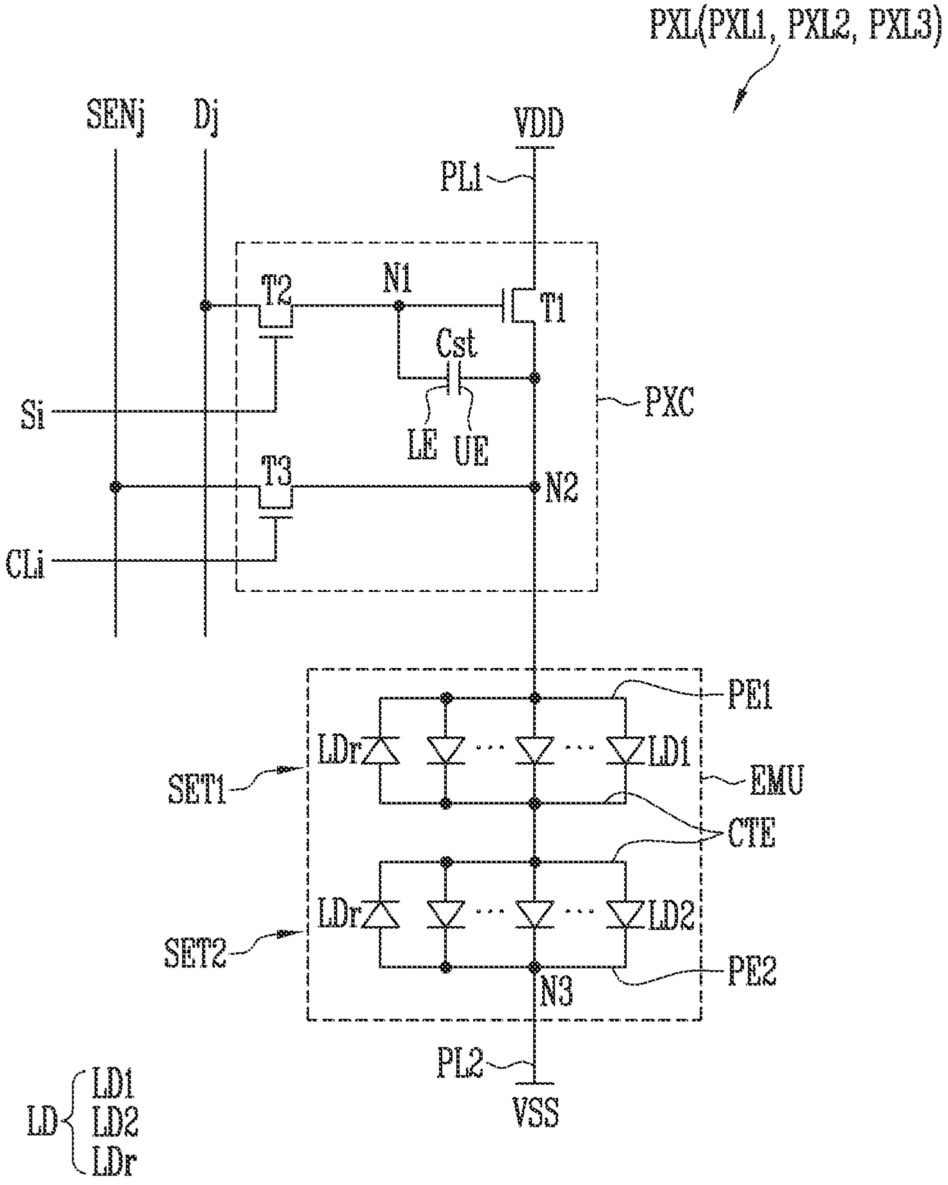
FIG. 4 is a circuit diagram illustrating an example of a pixel included in the display device of FIG. 3.

FIG. 4 is a circuit diagram illustrating an example of a pixel included in the display device of FIG. 3.

In the following embodiment, when the first pixel PXL1, the second pixel PXL2, and the third pixel PXL3 are collectively referred to, the first pixel PXL1, the second pixel PXL2, and the third pixel PXL3 are referred to as the pixel PXL.

Referring to FIGS. 1, 2, 3, and 4, the pixel PXL may include a pixel circuit PXC and a light emitting unit EMU.

Referring to FIGS. 1 to 4, the pixel PXL may include a light emitting unit EMU (or an emission unit) that generates light of a luminance corresponding to a data signal. In addition, the pixel PXL may selectively further include a pixel circuit PXC for driving the light emitting unit EMU.

According to one or more embodiments, the light emitting unit EMU may include a plurality of light emitting elements LD connected in parallel between a first power line PL1 that is connected to a first driving power VDD and to which a voltage of the first driving power VDD is applied and a second power line PL2 that is connected to second driving power VSS and to which a voltage of the second driving power VSS is applied. For example, the light emitting unit EMU may include a first pixel electrode PE1 connected to the first driving power VDD through the pixel circuit PXC and the first power line PL1, a second pixel electrode PE2 connected to the second driving power VSS through the second power line PL2, and the plurality of light emitting elements LD connected in parallel in the same direction between the first and second pixel electrodes PE1 and PE2. In one or more embodiments, the first pixel electrode PE1 may be an anode, and the second pixel electrode PE2 may be a cathode.

In one or more embodiments, each of the light emitting elements LD included in the light emitting unit EMU may include a first end connected to the first driving power VDD through the first pixel electrode PE1 and a second end connected to the second driving power VSS through the second pixel electrode PE2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the pixel PXL.

As described above, the respective light emitting elements LD connected in parallel in the same direction (for example, a forward direction) between the first pixel electrode PE1 and the second pixel electrode PE2 to which the voltages of the different power are supplied may configure respective effective light sources.

In one or more embodiments, the light emitting elements LD of the light emitting unit EMU may emit light with a luminance corresponding to a driving current supplied through a corresponding pixel circuit PXC. For example, a driving current corresponding to a grayscale value of corresponding frame data of the pixel circuit PXC may be supplied to the light emitting unit EMU during each frame period. The driving current supplied to the light emitting unit EMU may be divided and flow to each of the light emitting elements LD. Therefore, each of the light emitting elements LD may emit light with a luminance corresponding to the current flowing through the light emitting element LD, and thus the light emitting unit EMU may emit light of the luminance corresponding to the driving current.

In the above-described embodiment, an embodiment in which the both ends of one or more of the light emitting elements LD are connected in the same direction between the first and second driving power VDD and VSS is described, but the present disclosure is not limited thereto. According to one or more embodiments, the light emitting unit EMU may further include at least one ineffective light source, for example, a reverse light emitting element LDr, in addition to the light emitting elements LD configuring each effective light source. The reverse light emitting element LDr may be connected in parallel between the first and second pixel electrodes PE1 and PE2 together with the light emitting elements LD configuring the effective light sources, and may be connected between the first and second pixel electrodes PE1 and PE2 in a direction opposite to the light emitting elements LD. The reverse light emitting element LDr maintains an inactivated state even though a suitable driving voltage (e.g., a predetermined driving voltage, for example, a driving voltage of a forward direction) is applied between the first and second pixel electrodes PE1 and PE2, and thus a current substantially does not flow through the reverse light emitting element LDr.

The pixel circuit PXC may be connected to a scan line Si and a data line Dj of the pixel PXL. In addition, the pixel circuit PXC may be connected to a control line CLi and a sensing line SENj of the pixel PXL. For example, when the pixel PXL is disposed in an i-th row and a j-th column of the display area DA, the pixel circuit PXC of the pixel PXL may be connected to the i-th scan line Si and the j-th data line Dj, the i-th control line CLi, and the j-th sensing line SENj of the display area DA.

The pixel circuit PXC may include first to third transistors T1 to T3 and a storage capacitor Cst.

The first transistor T1 may be a driving transistor for controlling the driving current applied to the light emitting unit EMU, and may be connected between the first driving power VDD and the light emitting unit EMU. Specifically, a first terminal of the first transistor T1 may be connected (or coupled) to the first driving power VDD through the first power line PL1, a second terminal of the first transistor T1 may be connected to a second node N2, and a gate electrode of the first transistor T1 may be connected to a first node N1. The first transistor T1 may control an amount of the driving current applied from the first driving power VDD to the light emitting unit EMU through the second node N2, according to a voltage applied to the first node N1. In one or more embodiments, the first terminal of the first transistor T1 may be a drain electrode, and the second terminal of the first transistor T1 may be a source electrode, but the present disclosure is not limited thereto. According to one or more embodiments, the first terminal may be a source electrode and the second terminal may be a drain electrode.

The second transistor T2 may be a switching transistor that selects the pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 may be different terminals. For example, when the first terminal is a drain electrode, the second terminal may be a source electrode.

The second transistor T2 may be turned on when a scan signal of a gate-on voltage (for example, a high level voltage) is supplied from the scan line Si, to electrically connect the data line Dj and the first node N1. The first node N1 may be a point where the second terminal of the second transistor T2 and the gate electrode of the first transistor T1 are connected, and the second transistor T2 may transmit a data signal to the gate electrode of the first transistor T1.

The third transistor T3 may connect the first transistor T1 to the sensing line SENj to obtain a sensing signal through the sensing line SENj, and detect a characteristic of the pixel PXL including a threshold voltage and the like of the first transistor T1 using the sensing signal. Information on the characteristic of the pixel PXL may be used to convert image data so that a characteristic deviation between the pixels PXL may be compensated. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. In addition, the first terminal of the third transistor T3 may be connected to initialization power. The third transistor T3 may be an initialization transistor capable of initializing the second node N2, and may be turned on when a sensing control signal is supplied from the control line CLi, to transmit a voltage of the initialization power to the second node N2. Accordingly, a second storage electrode of the storage capacitor Cst connected to the second node N2 may be initialized.

A first storage electrode LE of the storage capacitor Cst may be connected to the first node N1, and a second storage electrode UE of the storage capacitor Cst may be connected to the second node N2. The storage capacitor Cst charges a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

In one or more embodiments, the light emitting unit EMU may be configured to include at least one series stage (or stage) including light emitting elements LD electrically connected to each other in parallel. In an example, the light emitting unit EMU may be configured in a series/parallel mixed structure. For example, the light emitting unit EMU may be configured in a two series stage structure including a first series stage SET1 and a second series stage SET2. However, the present disclosure is not limited thereto, and the light emitting unit EMU may be configured in four series stages including first to fourth series stages or six series stages including first to sixth series stages.

In one or more embodiments, the light emitting unit EMU may include the first series stage SET1 and the second series stage SET2 sequentially connected between the first driving power VDD and the second driving power VSS. Each of the first series stage SET1 and the second series stage SET2 may include two electrodes PE1 and CTE or CTE and PE2 configuring an electrode pair of a corresponding series stage, and a plurality of light emitting elements LD connected in parallel in the same direction between the two electrodes PE1 and CTE, and CTE and PE2.

In one or more embodiments, the first series stage SET1 (or a first stage) may include the first pixel electrode PE1 and a connection electrode CTE, and at least one first light emitting element LD1 connected between the first pixel electrode PE1 and the connection electrode CTE. In an example, the first series stage SET1 may include a reverse light emitting element LDr connected in a direction opposite to that of the first light emitting elements LD1 between the first pixel electrode PE1 and the connection electrode CTE.

In one or more embodiments, the second series stage SET2 (or a second stage) may include the connection electrode CTE and the second pixel electrode PE2, and at least one second light emitting element LD2 connected between the connection electrode CTE and the second pixel electrode PE2. In an example, the second series stage SET2 may include a reverse light emitting element LDr connected in a direction opposite to that of the second light emitting elements LD2 between the connection electrode CTE and the second pixel electrode PE2.

In one or more embodiments, the first pixel electrode PE1 of the first series stage SET1 may be an anode electrode of each pixel PXL, and the second pixel electrode PE2 of the second series stage SET2 may be a cathode electrode of each pixel PXL. In an example, the first pixel electrode PE1 may be electrically connected to the pixel circuit PXC through the second node N2. The second pixel electrode PE2 may be electrically connected to the second power line PL2 through a third node N3. The second node N2 may be a first point at which the pixel circuit PXC and the light emitting unit EMU are connected, and the third node N3 may be a second point at which the pixel circuit PXC and the light emitting unit EMU are connected.

In one or more embodiments, the light emitting unit EMU of the pixel PXL including the series stages SET1 and SET2 (or the light emitting elements LD) connected in a series and/or parallel mixed structure may easily control a current/voltage condition to conform to an applied product specification.

In one or more embodiments, the light emitting unit EMU may include series stages SET1 and SET2 (or light emitting elements LD) connected in a series/parallel mixed structure.

In FIG. 4, the first series stage SET1 and the second series stage SET2 are connected in series between the first power line PL1 and the second power line PL2, but the present disclosure is not limited thereto. A plurality of series stages (or stages) may be configured to be included between the first power line PL1 and the second power line PL2 in consideration of resolution of the display device DD, the area of the emission area of the pixel PXL, and the like. That is, the light emitting unit EMU may be configured in a series/parallel mixed structure. For example, the light emitting unit EMU may be configured in two series stages (for example, first and second series stages) or four series stages (for example, first to fourth series stages) between the first power line PL1 and the second power line PL2.

Referring to FIG. 4, the first series stage SET1 and the second series stage SET2 are sequentially disposed between the first driving power VDD and the second driving power VSS, but the present disclosure is not limited thereto. In an example, four or more series stages may be disposed between the first driving power VDD and the second driving power VSS. For example, when first to fourth series stages (for example, first to fourth series stages SET1, SET2, SET3, and SET4 of 5B) are disposed, the connection electrode CTE may include a plurality of connection electrodes, and may include an intermediate electrode (for example, an intermediate electrode CSE of FIG. 5B) disposed in one direction of the plurality of connection electrodes to electrically connect the plurality of connection electrodes.

In one or more embodiments, the connection electrode CTE may include at least one connection electrode. For example, the connection electrode CTE may include a first connection electrode, a second connection electrode, and a third connection electrode. In an example, the first to third connection electrodes may be electrically and physically connected. For example, the first to third connection electrodes may configure a connection electrode CTE electrically connecting the first series stage SET1 and the second series stage SET2.

Hereinafter, a pixel having the four series stages (for example, the first to fourth series stages SET1, SET2, SET3, and SET4) between the first driving power VDD and the second driving power VSS is described with reference to FIGS. 5A to 7B.

Figure 5A:
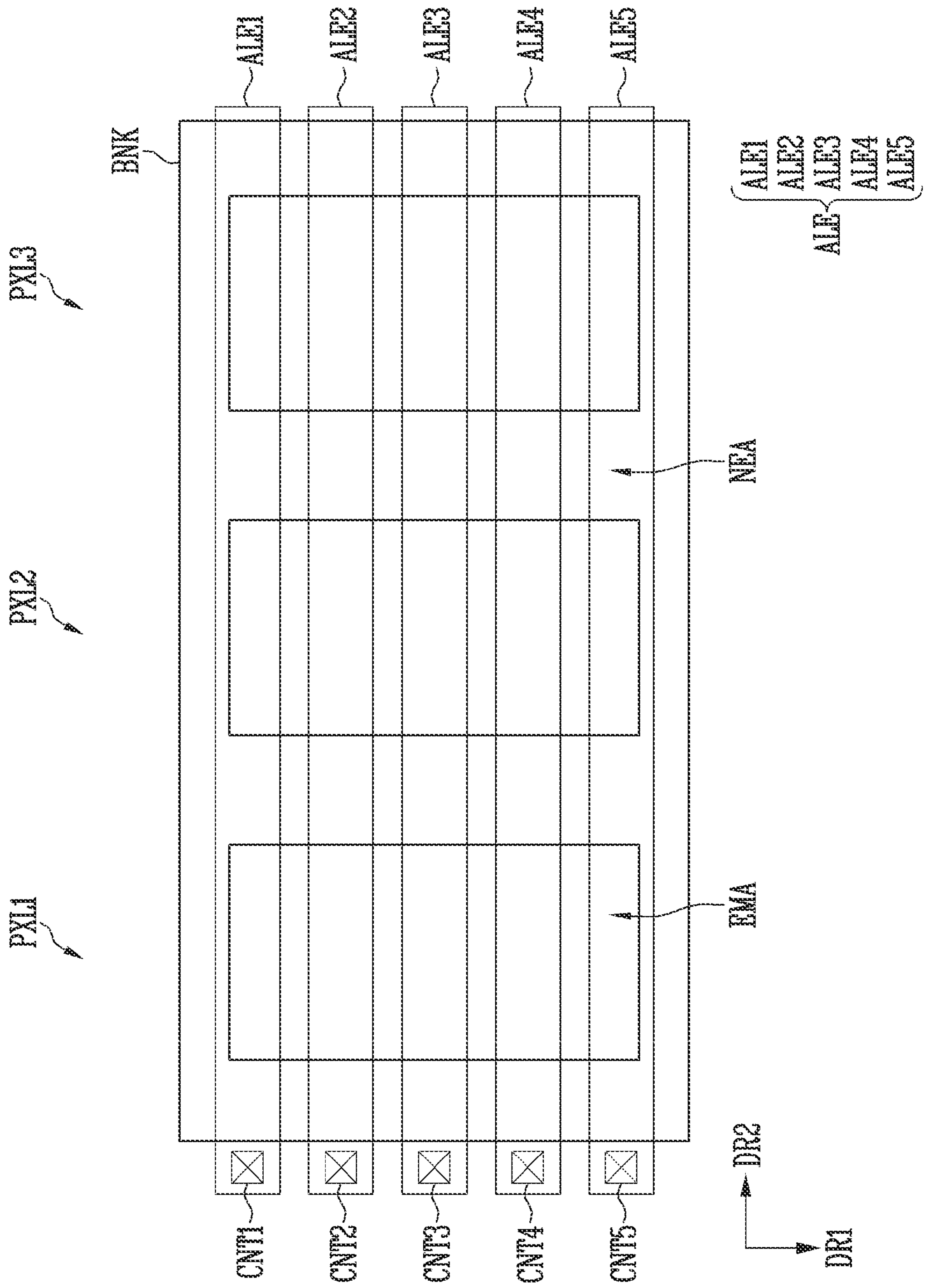
FIG. 5A is a schematic plan view illustrating an example of a bank partitioning pixels included in the display device of FIG. 3, and alignment electrodes.
Figure 5B:
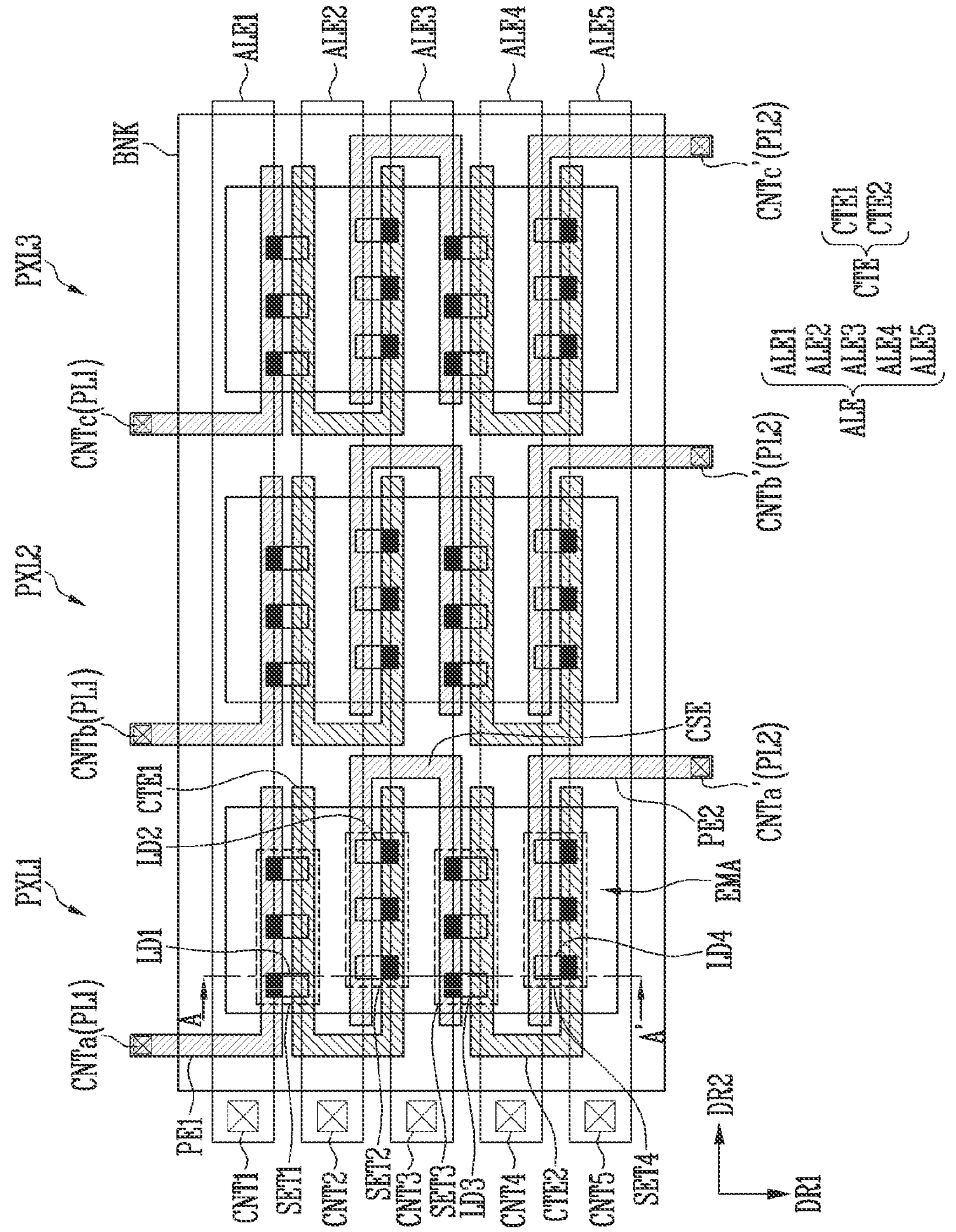
FIG. 5B is a schematic plan view illustrating an example of the pixels included in the display device of FIG. 3.

FIG. 5A is a schematic plan view illustrating an example of a bank partitioning the pixels included in the display device of FIG. 3, and alignment electrodes. FIG. 5B is a schematic plan view illustrating an example of the pixels included in the display device of FIG. 3.

FIG. 5A is a diagram illustrating the bank BNK for describing an emission area EMA and a non-emission area NEA of the pixels PXL1, PXL2, and PXL3 and alignment electrodes ALE for applying an alignment signal to the light emitting elements.

FIG. 5B is a diagram for describing some configurations included in the pixels PXL1, PXL2, and PXL3 based on the bank BNK and the alignment electrodes ALE of FIG. 5A.

Referring to FIGS. 5A and 5B, the display device may include the bank BNK, alignment electrodes ALE1 to ALE5, light emitting elements LD1 to LD4, the pixel electrodes PE1 and PE2, the connection electrodes CTE1 and CTE2, and the intermediate electrode CSE to configure the pixels PXL1, PXL2, and PXL3.

As shown in FIG. 5A, the bank BNK may partition the first pixel PXL1, the second pixel PXL2, and the third pixel PXL3. Each of the first pixel PXL1, the second pixel PXL2, and the third pixel PXL3 may include the emission area EMA.

In one or more embodiments, the first pixel PXL1, the second pixel PXL2, and the third pixel PXL3 may be sequentially disposed to be spaced from each other in a second direction DR2.

In one or more embodiments, the first pixel PXL1, the second pixel PXL2, and the third pixel PXL3 may emit light of different colors.

In one or more embodiments, the emission area EMA may correspond to an opening defined by the bank BNK.

In one or more embodiments, the bank BNK may form a space in which a fluid may be received. For example, during a manufacturing process, an ink including the light emitting elements LD1 to LD4 may be provided in the space in which the fluid may be received.

In one or more embodiments, the non-emission area NEA may be an area substantially corresponding to the bank BNK. When viewed in a plan view, the bank BNK may be around (e.g., may surround) the emission areas EMA.

As shown in FIGS. 5A and 5B, the emission areas EMA of each of the first pixel PXL1, the second pixel PXL2, and the third pixel PXL3 may include the four series stages SET1, SET2, SET3, and SET4.

Referring to FIG. 5A, the first pixel PXL1, the second pixel PXL2, and the third pixel PXL3 may include first to fifth alignment electrodes ALE1, ALE2, ALE3, ALE4, and ALE5. In an example, because the first pixel PXL1 to the third pixel PXL3 share the first to fifth alignment electrodes ALE1, ALE2, ALE3, ALE4, and ALE5, the description is based on the first pixel PXL1.

In one or more embodiments, the first to fifth alignment electrodes ALE1, ALE2, ALE3, ALE4, and ALE5 may be sequentially arranged to be spaced in a first direction DR1, and may extend in the second direction DR2. In an example, the first to fifth alignment electrodes ALE1, ALE2, ALE3, ALE4, and ALE5 may be disposed under the bank BNK.

In one or more embodiments, the first to fifth alignment electrodes ALE1, ALE2, ALE3, ALE4, and ALE5 may be electrodes for aligning the light emitting elements LD1, LD2, LD3, and LD4. In an example, first to fourth light emitting elements LD1, LD2, LD3, and LD4 may be moved (or rotated) by force (for example, dielectrophoresis (DEP) force) according to the electric field and aligned (or disposed) on the alignment electrode.

In one or more embodiments, each of the first to fifth alignment electrodes ALE1, ALE2, ALE3, ALE4, and ALE5 may be supplied (or provided) with a first alignment signal or a second alignment signal in a process step (hereinafter, an alignment process) in which the light emitting elements LD1, LD2, LD3, and LD4 are aligned.

In one or more embodiments, the first alignment signal and the second alignment signal may have different waveforms, potentials, and/or phases. The first alignment signal may be a ground signal, and the second alignment signal may be an AC signal. However, the present disclosure is not limited to the above-described example. For example, the first alignment signal may be an AC signal, and the second alignment signal may be a ground signal.

In one or more embodiments, the first alignment signal may be applied to the first alignment electrode ALE1, the third alignment electrode ALE3, and the fifth alignment electrode ALE5. The second alignment signal may be applied to the second alignment electrode ALE2 and the fourth alignment electrode ALE4. In an example, the second alignment electrode ALE2 may be disposed between the first alignment electrode ALE1 and the third alignment electrode ALE3, and the fourth alignment electrode ALE4 may be disposed between the third alignment electrode ALE3 and the fifth alignment electrodes ALE5. An alignment signal different from that of adjacent alignment electrodes may be applied to each of alignment electrodes.

In one or more embodiments, the first alignment electrode ALE1 may be connected to a first signal line located below the first alignment electrode ALE1 through a first contact hole CNT1, and in the alignment process, the first alignment signal may be provided to the first alignment electrode ALE1 through a first signal line.

In one or more embodiments, the second alignment electrode ALE2 may be disposed adjacent in the first direction DR1 of the first alignment electrode ALE1 and may extend in the second direction DR2. In an example, the second alignment electrode ALE2 may be connected to a second signal line located below the second alignment electrode ALE2 through a second contact hole CNT2, and in the alignment process, the second alignment signal may be provided to the second alignment electrode ALE2 through a second signal line.

In one or more embodiments, the third alignment electrode ALE3 may be disposed adjacent to the second alignment electrode ALE2 in the first direction DR1 and may extend in the second direction DR2. In an example, the third alignment electrode ALE3 may be connected to the lower first signal line through a third contact hole CNT3, and in the alignment process, the first alignment signal may be provided to the third alignment electrode ALE3 through the first signal line.

In one or more embodiments, the fourth alignment electrode ALE4 may be disposed adjacent to the third alignment electrode ALE3 in the first direction DR1 and may extend in the second direction DR2. In an example, the fourth alignment electrode ALE4 may be connected to the lower second signal line through a fourth contact hole CNT4, and in the alignment process, the second alignment signal may be provided to the fourth alignment electrode ALE4 through the second signal line.

In one or more embodiments, the fifth alignment electrode ALE5 may be disposed adjacent to the fourth alignment electrode ALE4 in the first direction DR1 and may extend in the second direction DR2. In an example, the fifth alignment electrode ALE5 may be connected to the lower first signal line through a fifth contact hole CNT5, and in the alignment process, the first alignment signal may be provided to the fifth alignment electrode ALE5 through the first signal line.

In one or more embodiments, a planar shape of the first to fifth alignment electrodes ALE1, ALE2, ALE3, ALE4, and ALE5 may be a bar shape.

In one or more embodiments, an electric field may be formed between (or on) the first alignment electrode ALE1 and the second alignment electrode ALE2, and the first light emitting elements LD1 may be aligned on (and/or between) the first alignment electrode ALE1 and the second alignment electrode ALE2 based on the electric field. In an example, an electric field may be formed between (or on) the second alignment electrode ALE2 and the third alignment electrode ALE3, and the second light emitting elements LD2 may be aligned on (and/or between) the second alignment electrode ALE2 and the third alignment electrode ALE3 based on the electric field. An electric field may be formed between (or on) the third alignment electrode ALE3 and the fourth alignment electrode ALE4, and the third light emitting elements LD3 may be aligned on (and/or between) the third alignment electrode ALE3 and the fourth alignment electrode ALE4 based on the electric field. An electric field may be formed between (or on) the fourth alignment electrode ALE4 and the fifth alignment electrode ALE5, and the fourth light emitting elements LD4 may be aligned on (and/or between) the fourth alignment electrode ALE4 and the fifth alignment electrode ALE5 based on the electric field.

Referring to FIG. 5B, the pixels PXL1, PXL2, and PXL3 may include the first pixel electrode PE1, the second pixel electrode PE2, the connection electrode CTE, and the intermediate electrode CSE. Because the second pixel PXL2 and the third pixel PXL3 are substantially the same as the first pixel PXL1, the first pixel PXL1 is mainly described.

In one or more embodiments, the first and second pixel electrodes PE1 and PE2, the connection electrode CTE, and the intermediate electrode CSE may be disposed on the first to fifth alignment electrodes ALE1, ALE2, ALE3, ALE4, and ALE5.

In one or more embodiments, the connection electrode CTE may include a plurality of connection electrodes. In an example, the number of connection electrodes CTE may be determined based on the number of series stages in the emission area of the first pixel PXL1. For example, when the pixel is configured of two series stages, the connection electrode CTE may be one (refer to FIG. 8). When the pixel is configured of four series stages, a first connection electrode CTE1 and a second connection electrode CTE2 may be included as shown in FIG. 5B. When the pixel is configured of six series stages, the connection electrode CTE may include a first connection electrode CTE1, a second connection electrode CTE2, and a third connection electrode CTE3 (refer to FIG. 9).

In one or more embodiments, the first pixel electrode PE1, the first connection electrode CTE1, the intermediate electrode CSE, the second connection electrode CTE2, and the second electrode PE2 may be sequentially arranged along the first direction DR1 in the emission area EMA.

In one or more embodiments, the first pixel electrode PE1 may overlap a portion of the first alignment electrode ALE1. In an example, the first pixel electrode PE1 may be physically and/or electrically connected to the first power line PL1 of the pixel circuit (for example, the pixel circuit PXC of FIG. 4) through a contact hole CNTa. In an example, the first pixel electrode PE1 may be connected to the first driving power VDD through the first power line PL1.

In one or more embodiments, the second pixel electrode PE2 may overlap a portion of the fourth alignment electrode ALE4. In an example, the second pixel electrode PE2 may be physically and/or electrically connected to the second power line PL2 of the pixel circuit PXC through a contact hole CNTa'. In an example, the second pixel electrode PE2 may be connected to the second driving power VSS through the second power line PL2.

In one or more embodiments, the first connection electrode CTE1, the intermediate electrode CSE, and the second connection electrode CTE2 may be sequentially disposed between the first pixel electrode PE1 and the second pixel electrode PE2.

In one or more embodiments, the first connection electrode CTE1, the second connection electrode CTE2, and the intermediate electrode CSE may have a shape bent at least once.

In one or more embodiments, the first connection electrode CTE1 may be disposed to be spaced in the first direction DR1 from the first pixel electrode PE1. The intermediate electrode CSE may be disposed to be spaced in the first direction DR1 of the first connection electrode CTE1, and one area of the intermediate electrode CSE may be disposed alternately to the first connection electrode CTE1.

In one or more embodiments, the first connection electrode CTE1 may have a shape bent to surround one side of the intermediate electrode CSE. The intermediate electrode CSE may have a shape bent to surround one side of the first connection electrode CTE1.

In one or more embodiments, the first connection electrode CTE1 and the intermediate electrode CSE may be disposed to be around (to surround) one side of each other. In an example, as the first connection electrode CTE1 and the intermediate electrode CSE are formed to be around (e.g., to surround) one side of each other, the first connection electrode CTE1 and the intermediate electrode CSE may be disposed to alternate each other in the first direction DR1.

In one or more embodiments, the first light emitting elements LD1 connected in parallel between the first pixel electrode PE1 and the first connection electrode CTE1 may configure the first series stage SET1 of the light emitting unit (for example, the light emitting unit EMU of FIG. 4). In an example, first ends of the first light emitting elements LD1 may be connected to the first pixel electrode PE1, and second ends of the first light emitting elements LD1 may be connected to the first connection electrode CTE1.

In one or more embodiments, the second light emitting elements LD2 connected in parallel between the intermediate electrode CSE and the first connection electrode CTE1 may configure the second series stage SET2 of the light emitting unit EMU. In an example, first ends of the second light emitting elements LD2 may be connected to the first connection electrode CTE1, and second ends of the second light emitting elements LD2 may be connected to the intermediate electrode CSE.

In one or more embodiments, the first ends of the first light emitting elements LD1 may be disposed to face a direction opposite to the first direction DR1, but the first ends of the second light emitting elements LD2 may be disposed to face the first direction DR1.

In one or more embodiments, the first connection electrode CTE1 may be disposed to be spaced in the first direction DR1 of the first and second light emitting elements LD1 and LD2 of each of the first series stage SET1 and the second series stage SET2.

In one or more embodiments, the second connection electrode CTE2 may be disposed to be spaced in the first direction DR1 of the intermediate electrode CSE. The second connection electrode CTE2 may have a shape bent at least once to be around (to surround) the second pixel electrode PE2. A portion of the second connection electrode CTE2 may be disposed to be spaced in the first direction DR1 of the second pixel electrode PE2.

In one or more embodiments, the third light emitting elements LD3 connected in parallel between the intermediate electrode CSE and the second connection electrode CTE2 may configure the third series stage SET3 of the light emitting unit EMU. In an example, first ends of the third light emitting elements LD3 may be connected to the intermediate electrode CSE, and second ends of the third light emitting elements LD3 may be connected to the second connection electrode CTE2.

In one or more embodiments, the first end of the first light emitting elements LD1 and the first end of the third light emitting elements LD3 may be disposed to face the direction opposite to the first direction DR1.

In one or more embodiments, the intermediate electrode CSE may be disposed to be spaced in the direction opposite to the first direction DR1 from one end of the second and third light emitting elements LD2 and LD3 of the respective second series stage SET2 and third series stage SET3.

In one or more embodiments, the fourth light emitting elements LD4 connected in parallel between the second pixel electrode PE2 and the second connection electrode CTE2 may configure the fourth series stage SET4 of the light emitting unit EMU. In an example, first ends of the fourth light emitting elements LD4 may be connected to the second connection electrode CTE2 and second ends of the fourth light emitting elements LD4 may be connected to the second pixel electrode PE2.

In one or more embodiments, the first end of the second light emitting elements LD2 and the first end of the fourth light emitting elements LD4 may be disposed to face the first direction DR1.

In one or more embodiments, the first connection electrode CTE1 may be disposed in one direction of the first light emitting elements LD1 and the second light emitting elements LD2 to be in contact with the first light emitting elements LD1 and the second light emitting element LD2.

In one or more embodiments, the second connection electrode CTE2 may be disposed to be spaced in the first direction DR1 from one end of the third and fourth light emitting elements LD3 and LD4 of the respective third series stage SET3 and fourth series stage SET4.

In one or more embodiments, the first pixel electrode PE1 may be connected to the first driving power VDD through the first power line PL1 connected to the contact hole CNTa, and thus the driving current may flow to the first light emitting elements LD1, the first connection electrode CTE1, the second light emitting elements LD2, the intermediate electrode CSE, the third light emitting elements LD3, the second connection electrode CTE2, the fourth light emitting elements LD4, and the second pixel electrode PE2 during each frame period. The second pixel electrode PE2 may be connected to the second driving power VSS through the second power line PL2 connected to the contact hole CNTa'.

Hereinafter, shapes of the first and second pixel electrodes PE1 and PE2, the first and second connection electrodes CTE1 and CTE2, and the intermediate electrode CSE are described with reference to FIG. 6.

Figure 6:
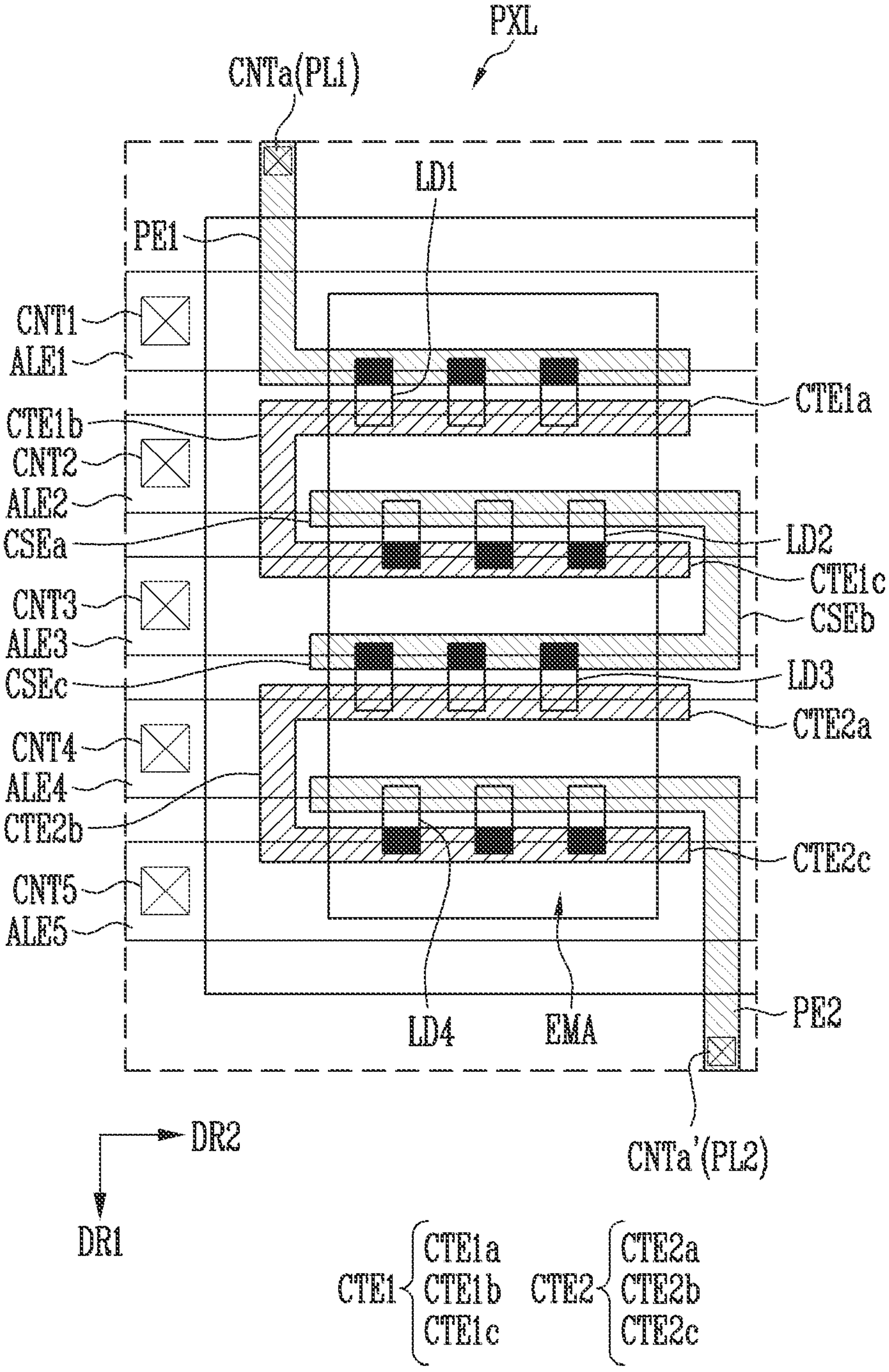
FIG. 6 is an enlarged view illustrating an example of the pixel of FIG. 5B.

FIG. 6 is an enlarged view illustrating an example of the pixel of FIG. 5B.

In one or more embodiments, the pixel PXL having the four series structure may include the first to fifth alignment electrodes ALE1, ALE2, ALE3, ALE4, and ALE5, the first to fourth light emitting elements LD1, LD2, LD3, and LD4, the first and second pixel electrodes PE1 and PE2, the first and second connection electrodes CTE1 and CTE2, and the intermediate electrode CSE.

Referring to FIG. 6, the first connection electrode CTE1, the second connection electrode CTE2, and the intermediate electrode CSE may have a shape bent at least once.

In one or more embodiments, the first connection electrode CTE1 may include a first portion CTE1*a*, a second portion CTE1*b*, and a third portion CTE1*c*. The second connection electrode CTE2 may include a first portion CTE2*a*, a second portion CTE2*b*, and a third portion CTE2*c*. The intermediate electrode CSE may include a first portion CSEa, a second portion CSEb, and a third portion CSEc.

In one or more embodiments, the first light emitting elements LD1 may be disposed between the first pixel electrode PE1 and the first connection electrode CTE1.

In an example, the first portion CTE1*a* of the first connection electrode CTE1 may be disposed in the first direction DR1 of the first light emitting elements LD1 to be in contact with the second end of the first light emitting elements LD1. The third portion CTE1*c* of the first connection electrode CTE1 may be disposed in the first direction DR1 of the second light emitting elements LD2 to be in contact with the first end of the second light emitting elements LD2. The second portion CTE1*b* of the first connection electrode CTE1 may connect the first portion CTE1*a* and the third portion CTE1*c* and may be integrally formed with the first portion CTE1*a* and the third portion CTE1*c*.

In one or more embodiments, the first connection electrode CTE1 may be around (e.g., may surround) one side of the intermediate electrode CSE. For example, the first connection electrode CTE1 may surround the first portion CSEa of the intermediate electrode CSE.

In one or more embodiments, the second light emitting elements LD2 may be disposed between the first portion CSEa of the intermediate electrode CSE and the third portion CTE1*c* of the first connection electrode CTE1.

In one or more embodiments, the first portion CSEa of the intermediate electrode CSE may be disposed in the direction opposite to the first direction DR1 of the second light emitting elements LD2 to be in contact with the second end of the second light emitting elements LD2. The third portion CSEc of the intermediate electrode CSE may be disposed in the direction opposite to the first direction DR1 of the third light emitting elements LD3 to be in contact with the first end of the third light emitting elements LD3. The second portion CSEb of the intermediate electrode CSE may connect the first portion CSEa and the third portion CSEc and may be integrally formed with the first portion CSEa and the third portion CSEc.

In one or more embodiments, a portion of the first connection electrode CTE1 and the intermediate electrode CSE may be disposed to alternate each other. In an example, as a portion of the first connection electrode CTE1 and the intermediate electrode CSE are disposed to alternate each other, the first pixel electrode PE1, the first portion CTE1*a* of the first connection electrode CTE1, the first portion CSEa of the intermediate electrode CSE, the third portion CTE1*c* of the first connection electrode CTE1, and the third portion CSEc of the intermediate electrode CSE may be disposed along the first direction DR1.

In one or more embodiments, the second connection electrode CTE2 may be disposed to be spaced apart in the first direction DR1 of the intermediate electrode CSE.

In one or more embodiments, the third light emitting elements LD3 may be disposed between the third portion CSEc of the intermediate electrode CSE and the first portion CTE2*a* of the second connection electrode CTE2.

In one or more embodiments, the first portion CTE2*a* of the second connection electrode CTE2 may be disposed in the first direction DR1 of the third light emitting elements LD3 to be in contact with the second end of the third light emitting elements LD3. The third portion CTE2*c* of the second connection electrode CTE2 may be disposed in the first direction DR1 of the fourth light emitting elements LD4 to be in contact with the first end of the fourth light emitting elements LD4. The second portion CTE2*b* of the second connection electrode CTE2 may be integrally formed with the first portion CTE2*a* and the third portion CTE2*c* while connecting the first portion CTE2*a* and the third portion CTE2*c*.

In one or more embodiments, the second connection electrode CTE2 may be around (e.g., may surround) one side of the second pixel electrode PE2. In an example, the third portion CTE2*c* of the second connection electrode CTE2 may be disposed in the first direction DR1 of the second pixel electrode PE2.

In one or more embodiments, the fourth light emitting elements LD4 may be disposed between the second pixel electrode PE2 and the third portion CTE2*c* of the second connection electrode CTE2.

In one or more embodiments, the first to fourth light emitting elements LD1, LD2, LD3, and LD4 may be electrically connected through the first and second connection electrodes CTE1 and CTE2 and the intermediate electrode CSE.

In one or more embodiments, an arrangement direction of the first and third light emitting elements LD1 and LD3 may be opposite to an arrangement direction of the second and fourth light emitting elements LD2 and LD4.

In one or more embodiments, the second portion CTE1*b* of the first connection electrode CTE1, the second portion CTE2*b* of the second connection electrode CTE2, and the second portion CSEb of the intermediate electrode CSE may overlap the bank BNK when viewed in a plan view.

Figure 7A:
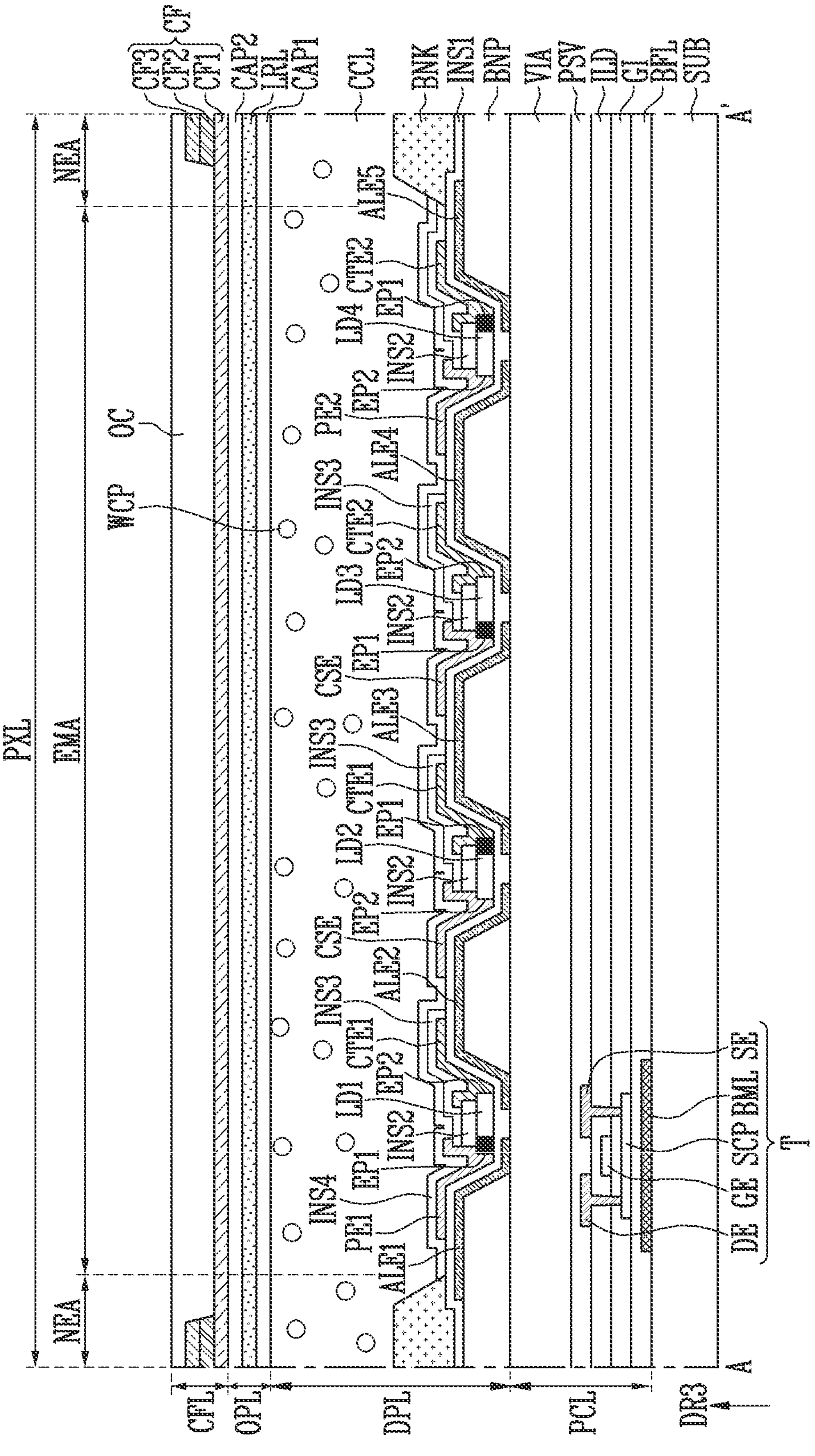
FIG. 7A is a schematic cross-sectional view illustrating an example taken along the line A-A' of FIG. 5B.

FIG. 7A is a schematic cross-sectional view illustrating an example taken along the line A-A' of FIG. 5B.

Referring to FIG. 7A, the pixel PXL may include a substrate SUB, a pixel circuit layer PCL, and a display element layer DPL.

In one or more embodiments, the pixel circuit layer PCL and the display element layer DPL may be disposed to overlap each other on one surface of the substrate SUB. In an example, a pixel area PXA of the substrate SUB may include the pixel circuit layer PCL disposed on one surface of the substrate SUB and the display element layer DPL disposed on the pixel circuit layer PLC. However, a mutual position of the pixel circuit layer PLC and the display element layer DPL on the substrate SUB may vary in one or more embodiments. When the pixel circuit layer PCL and the display element layer DPL are separated as separate layers and overlapped, each layout space for forming the pixel circuit layer PCL and the light emitting unit EMU may be sufficiently secured on a plane. In another example, the pixel circuit layer PCL and the display element layer DPL may not overlap and may be disposed on (or at) the same plane.

In one or more embodiments, the pixel circuit layer PCL may include at least one insulating layer disposed on the substrate SUB. In an example, the pixel circuit layer PCL may include a buffer layer BFL, a gate insulating layer GI, an interlayer insulating layer ILD, a passivation layer PSV, and a via layer VIA sequentially stacked on one surface along a third direction DR3.

In one or more embodiments, the buffer layer BFL may be entirely disposed on the substrate SUB. The buffer layer BFL may prevent an impurity from being diffused into transistors T (for example, the first, second, and third transistors T1, T2, and T3 of FIG. 4) included in the pixel circuit layer PCL. The buffer layer BFL may be an inorganic insulating layer including an inorganic material. In an example, the buffer layer BFL may include at least one selected from among a metal oxide such as silicon nitride ($SiN_x$), silicon oxide ($SiO_x$), silicon oxynitride ($SiO_xN_y$), and aluminum oxide ($AlO_x$). The buffer layer BFL may be provided as a single layer, but may also be provided as multiple layers of at least double layers. When the buffer layer BFL is provided in the multiple layers, each layer may be formed of the same material or different materials. The buffer layer BFL may be omitted according to a material, a process condition, and the like of the substrate SUB.

In one or more embodiments, the gate insulating layer GI may be entirely disposed on the buffer layer BFL. The gate insulating layer GI may include the same material as the buffer layer BFL or may include a material suitable from the materials exemplified as the configuration material of the buffer layer BFL. For example, the gate insulating layer GI may be an inorganic insulating layer including an inorganic material.

In one or more embodiments, the interlayer insulating layer ILD may be entirely provided and/or formed on the gate insulating layer GI. The interlayer insulating layer ILD may include the same material as the gate insulating layer GI or may include one or more materials selected from the materials exemplified as the configuration material of the gate insulating layer GI.

In one or more embodiments, the passivation layer PSV may be entirely provided and/or formed on the interlayer insulating layer ILD. The passivation layer PSV may be an inorganic insulating layer including an inorganic material or an organic insulating layer including an organic material.

In one or more embodiments, the passivation layer PSV may be partially opened to expose a partial configuration of the pixel circuit PXC.

In one or more embodiments, the via layer VIA may be entirely provided and/or formed on the passivation layer PSV. The via layer VIA may be configured as a single layer including an organic layer or multiple layers of double or more layers. According to one or more embodiments, the via layer VIA may be provided in a form including an inorganic layer and an organic layer disposed on the inorganic layer. When the via layer VIA is provided as the multiple layers of double or more layers, an organic layer configuring the via layer VIA may be positioned at an uppermost layer. The via layer VIA may include at least one selected from among acrylic resin (polyacrylates resin), epoxy resin, phenol resin, polyamide resin, polyimide rein, unsaturated polyester resin, polyphenylene ethers resin, polyphenylene sulfide resin, and benzocyclobutene resin.

In one or more embodiments, the via layer VIA may be utilized as a planarization layer for alleviating a step difference generated by the configurations of the pixel circuit PXC positioned thereunder in the pixel circuit layer PCL.

In one or more embodiments, the pixel circuit layer PCL may include at least one conductive layer disposed between the above-described insulating layers. For example, the pixel circuit layer PCL may include a first conductive layer disposed between the substrate SUB and the buffer layer BFL, a second conductive layer disposed on the gate insulating layer GI, and a third conductive layer disposed on the interlayer insulating layer ILD. In an example, the first conductive layer may form a single layer formed of a material selected from the group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed as double layers or multiple layers of molybdenum (Mo), titanium (Ti), copper (Cu), aluminum (Al) or silver (Ag), which is a low-resistance material to reduce a line resistance. Each of the second and third conductive layers may include the same material as the first conductive layer or may include one or more materials suitable from the materials exemplified as the configuration material of the first conductive layer, but the present disclosure is not limited thereto.

In one or more embodiments, the substrate SUB may include a transparent insulating material to transmit light. The substrate SUB may be a rigid substrate or a flexible substrate. The rigid substrate may be one of a glass substrate, a quartz substrate, a glass ceramic substrate, and a crystalline glass substrate. The flexible substrate may be one of a film substrate and a plastic substrate including a polymer organic material.

In one or more embodiments, the pixel circuit PXC may include at least one transistor T. The transistor T may be a driving transistor controlling the driving current of the light emitting element LD, and may have the same configuration as the first transistor T1 described with reference to FIG. 4.

In one or more embodiments, the transistor T may include a semiconductor pattern SCP, a gate electrode GE overlapping a portion of the semiconductor pattern SCP in a thickness direction of the substrate SUB (e.g., a third direction DR3), and source and drain electrodes SE and DE connected to the semiconductor pattern SCP.

In one or more embodiments, the gate electrode GE may be provided and/or formed on the gate insulating layer GI. For example, the gate electrode GE may be the second conductive layer positioned between the gate insulating layer GI and the interlayer insulating layer ILD. The gate electrode GE may overlap a portion of the semiconductor pattern SCP in the third direction DR3. For example, the gate electrode GE may overlap an active pattern of the semiconductor pattern SCP.

In one or more embodiments, the semiconductor pattern SCP may be provided and/or formed on the buffer layer BFL. The semiconductor pattern SCP may be positioned between the buffer layer BFL and the gate insulating layer GI. The semiconductor pattern SCP may be a semiconductor layer formed of polysilicon, amorphous silicon, an oxide semiconductor, or the like. The semiconductor pattern SCP may include an active pattern, a first contact area, and a second contact area. The active pattern, the first contact area, and the second contact area may be formed of a semiconductor layer that is not doped with an impurity or doped with an impurity. For example, the first contact area and the second contact area may be formed of a semiconductor layer doped with an impurity, and the active pattern may be formed of a semiconductor layer that is not doped with an impurity. As an impurity, for example, an n-type impurity may be used, but is not limited thereto.

In one or more embodiments, the active pattern of the semiconductor pattern SCP may be an area overlapping the gate electrode GE of the transistor T, and may be a channel area. The first contact area of the semiconductor pattern SCP may be in contact with one end of the active pattern. In addition, the first contact area may be connected to the source electrode SE. The second contact area of the semiconductor pattern SCP may contact another end of the active pattern. In addition, the second contact area may be connected to the drain electrode DE.

In one or more embodiments, the source electrode SE may be the third conductive layer provided and/or formed on the interlayer insulating layer ILD. The source electrode SE may contact the first contact area of the semiconductor pattern SCP through a contact hole passing through the gate insulating layer GI and the interlayer insulating layer ILD.

In one or more embodiments, the drain electrode DE may be the third conductive layer provided and/or formed on the interlayer insulating layer ILD. The drain electrode DE may be disposed on the interlayer insulating layer ILD to be spaced from the source electrode SE. The drain electrode DE may contact the second contact area of the semiconductor pattern SCP through a contact hole passing through the gate insulating layer GI and the interlayer insulating layer ILD.

In one or more embodiments, a lower metal pattern BML may be disposed under the transistor T. The lower metal pattern BML may be the first conductive layer positioned between the substrate SUB and the buffer layer BFL. The lower metal pattern BML may be electrically connected to the transistor T. In this case, a driving range of a suitable voltage (e.g., a predetermined voltage) supplied to the gate electrode GE of the transistor T may be widened. In one or more embodiments, the lower metal pattern BML may be electrically connected to the semiconductor pattern SCP of the transistor T to stabilize the channel area of the transistor T. In addition, as the lower metal pattern BML is electrically connected to the transistor T, floating of the lower metal pattern BML may be prevented.

In the above-described embodiment, a case in which the transistor T is a thin film transistor (TFT) having a top gate structure is described as an example, but the present disclosure is not limited thereto, and a structure of the transistor T may be variously changed.

In one or more embodiments, the display element layer DPL may be formed on the via layer VIA.

In one or more embodiments, the display element layer DPL of each pixel PXL may include the first pixel electrode PE1, the second pixel electrode PE2, the first connection electrode CTE1, the second connection electrode CTE2, and the intermediate electrode CSE disposed in the emission area EMA.

In one or more embodiments, the display element layer DPL may further include insulating patterns and/or an insulating layer sequentially disposed on one surface of the pixel circuit layer PCL. For example, the display element layer DPL may further include a bank pattern BNP, a first insulating layer INS1, a second insulating layer INS2, a third insulating layer INS3, and a fourth insulating layer INS4.

In one or more embodiments, the bank pattern BNP may be provided and/or formed on the via layer VIA of the pixel circuit layer PCL. In an example, the bank pattern BNP may include a support member and/or a wall pattern. In one or more embodiments, the bank pattern BNP may be formed as a separate pattern that is individually disposed under the first to fifth alignment electrodes ALE1, ALE2, ALE3, ALE4, and ALE5 to overlap a portion of the first to fifth alignment electrodes ALE1, ALE2, ALE3, ALE4, and ALE5.

In one or more embodiments, the bank pattern BNP may have an opening or a concave portion corresponding to areas between the first to fifth alignment electrodes ALE1, ALE2, ALE3, ALE4, and ALE5 in the emission area EMA, and may be formed as an integral pattern entirely connected in the display area DA.

In one or more embodiments, the bank pattern BNP may protrude upward in the third direction DR3 on one surface of the pixel circuit layer PCL. One area of each of the first to fifth alignment electrodes ALE1, ALE2, ALE3, ALE4, and ALE5 disposed on the bank pattern BNP may protrude in the third direction DR3 (or a thickness direction of the substrate SUB).

In one or more embodiments, the bank pattern BNP may be an inorganic layer including an inorganic material or an organic layer including an organic material. According to one or more embodiments, the bank pattern BNP may include an organic layer of a single layer and/or an inorganic layer of a single layer, but is not limited thereto. According to one or more embodiments, the bank pattern BNP may be provided in a form of multiple layers in which at least one organic layer and at least one inorganic layer are stacked. However, a material of the bank pattern BNP is not limited to the above-described embodiment, and according to one or more embodiments, the bank pattern BNP may include a conductive material (or substance). A shape of the bank pattern BNP may be variously changed within a range capable of improving efficiency of light emitted from the light emitting elements LD1, LD2, LD3, and LD4.

In one or more embodiments, the bank pattern BNP may be utilized as a reflective member. For example, the bank pattern BNP may be utilized as a reflective member for improving light output efficiency of the pixel PXL by guiding the light emitted from the light emitting elements LD1, LD2, LD3, and LD4 disposed thereon in a desired direction.

In one or more embodiments, the first to fifth alignment electrodes ALE1, ALE2, ALE3, ALE4, and ALE5 may be provided and/or formed on the bank pattern BNP.

In one or more embodiments, the first to fifth alignment electrodes ALE1, ALE2, ALE3, ALE4, and ALE5 may include a conductive material. For example, the first to fifth alignment electrodes ALE1, ALE2, ALE3, ALE4, and ALE5 may include one or more selected from among silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the first to fifth alignment electrodes ALE1, ALE2, ALE3, ALE4, and ALE5 are not limited to the above-described example.

In one or more embodiments, a portion of the first alignment electrode ALE1 and the fifth alignment electrode ALE5 may be disposed under the bank BNK to overlap the bank BNK.

In one or more embodiments, the first insulating layer INS1 may be entirely provided on the first to fifth alignment electrodes ALE1, ALE2, ALE3, ALE4, and ALE5. The first insulating layer INS1 may be partially opened in the non-emission area NEA to expose configurations positioned thereunder. For example, the first insulating layer INS1 may include a contact hole (for example, the contact hole CNTa of FIG. 5B) for electrically connecting the first pixel electrode PE1 and the first power line (for example, the first power line PL1 of FIG. 4), and a contact hole (for example, the contact hole CNTa' of FIG. 5B) for electrically connecting the second pixel electrode PE2 and the second power line (for example, the second power line PL2 of FIG. 4).

In one or more embodiments, the second insulating layer INS2 may be provided and/or formed on each of the first to fourth light emitting elements LD1, LD2, LD3, and LD4. The second insulating layer INS2 may be positioned on the first to fourth light emitting elements LD1, LD2, LD3, and LD4 to partially cover an outer surface (e.g., an outer peripheral or circumferential surface or surface) of each of the first to fourth light emitting elements LD1, LD2, LD3, and LD4 and expose the first end EP1 and the second end EP2 of each of the first to fourth light emitting elements LD1, LD2, LD3, and LD4 to the outside. In addition, the second insulating layer INS2 may be formed on the first insulating layer INS1 at least in the non-emission area NEA and may be partially opened to expose a partial configuration positioned thereunder.

In one or more embodiments, by forming the second insulating layer INS2 on the first to fourth light emitting elements LD1, LD2, LD3, and LD4, the first to fourth light emitting elements LD1, LD2, LD3, and LD4 may be prevented from being separated from aligned positions.

In one or more embodiments, the second insulating layer INS2 may include an inorganic insulating layer including an inorganic material, or an organic insulating layer. For example, the second insulating layer INS2 may include an inorganic insulating layer suitable for protecting active layers (for example, the active layer 12 of FIG. 2) of each of the first to fourth light emitting elements LD1, LD2, LD3, and LD4 from external oxygen, moisture, and the like. However, the present disclosure is not limited thereto, and the second insulating layer INS2 may be configured of an organic insulating layer including an organic material according to a design condition or the like of a display device to which the first to fourth light emitting elements LD1, LD2, LD3, and LD4 are applied. The second insulating layer INS2 may be configured as a single layer or multiple layers.

In one or more embodiments, the first and second pixel electrodes PE1 and PE2, the first and second connection electrodes CTE1 and CTE2, the intermediate electrode CSE, and third and fourth insulating layers INS3 and INS4 may be formed on the first and second insulating layers INS1 and INS2.

In one or more embodiments, the first connection electrode CTE1 and the intermediate electrode CSE may be disposed to alternate each other. In an example, a portion of the first connection electrode CTE1 (for example, the first portion CTE1*a* of FIG. 6), a portion of the intermediate electrode CSE (for example, the first portion CSEa of FIG. 6), another portion of the first connection electrode CTE1 (for example, the third portion CTE1*c* of FIG. 6), and another portion of the intermediate electrode CSE (for example, the third portion CSEc of FIG. 6) may be sequentially formed on the first insulating layer INS1.

In one or more embodiments, the first connection electrode CTE1 may be disposed in one direction (for example, the first direction DR1 of FIG. 6) of the first light emitting elements LD1 and the second light emitting elements LD2. The first connection electrode CTE1 may directly contact the second end EP2 of the first light emitting elements LD1 and the first end EP1 of the second light emitting elements LD2. The first light emitting elements LD1 and the second light emitting elements LD2 may be electrically connected to each other through the first connection electrode CTE1.

In one or more embodiments, the intermediate electrode CSE may be disposed in another direction (for example, in the direction opposite to the first direction DR1 of FIG. 6) of the second light emitting elements LD2 and the third light emitting elements LD3. The intermediate electrode CSE may directly contact the second end EP2 of the second light emitting elements LD2 and the first end EP1 of the third light emitting elements LD3. The second light emitting elements LD2 and the third light emitting elements LD3 may be electrically connected to each other through the intermediate electrode CSE.

In one or more embodiments, the second connection electrode CTE2 may be disposed in one direction (for example, the first direction DR1 of FIG. 6) of the third light emitting elements LD3 and the fourth light emitting elements LD4. The second connection electrode CTE2 may directly contact the second end EP2 of the third light emitting elements LD3 and the first end EP1 of the fourth light emitting elements LD4. The third light emitting elements LD3 and the fourth light emitting elements LD4 may be electrically connected to each other through the second connection electrode CTE2.

In one or more embodiments, the first and second pixel electrodes PE1 and PE2, the first and second connection electrodes CTE1 and CTE2, and the intermediate electrode CSE may be disposed on (or at) the same layer of the display element layer DPL.

Thereafter, the third insulating layer INS3 may be formed to cover the second insulating layer INS2 and the first and second connection electrodes CTE1 and CTE2. The fourth insulating layer INS4 may be formed in the emission area EMA to cover the third insulating layer INS3, the first and second pixel electrodes PE1 and PE2, and the intermediate electrode CSE.

In one or more embodiments, the fourth insulating layer INS4 may be positioned on the first and second pixel electrodes PE1 and PE2, the first and second connection electrodes CTE1 and CTE2, and the intermediate electrode CSE to cover the first and second pixel electrodes PE1 and PE2, the first and second connection electrodes CTE1 and CTE2, and the intermediate electrode CSE, thereby preventing corrosion of the first and second pixel electrodes PE1 and PE2, the first and second connection electrodes CTE1 and CTE2, and the intermediate electrode CSE.

In one or more embodiments, the third insulating layer INS3 and the fourth insulating layer INS4 may include an inorganic insulating layer formed of an inorganic material or an organic insulating layer formed of an organic material. For example, the third insulating layer INS3 may include at least one selected from among a metal oxide such as silicon nitride ($SiN_x$), silicon oxide ($SiO_x$), silicon oxynitride ($SiO_xN_y$), and aluminum oxide ($AlO_x$), but is not limited thereto. In addition, the third insulating layer INS3 may be formed as a single layer or multiple layers.

In one or more embodiments, the first and second pixel electrodes PE1 and PE2, the first and second connection electrodes CTE1 and CTE2, and the intermediate electrode CSE may be formed of various transparent conductive materials to allow the light emitted from each of the first to fourth light emitting elements LD1, LD2, LD3, and LD4 to proceed in an image display direction (for example, the third direction DR3) of the display device DD without loss (e.g., without significant loss). For example, the first and second pixel electrodes PE1 and PE2, the first and second connection electrodes CTE1 and CTE2, and the intermediate electrode CSE may include at least one selected from among various transparent conductive materials (or substances) including indium tin oxide (ITO), indium zinc oxide (IZO), zinc oxide (ZnOx), indium gallium zinc oxide (IGZO), indium tin zinc oxide (ITZO), and the like, and may be configured to be substantially transparent or translucent to satisfy a desired light transmittance (e.g., a predetermined light transmittance or transmittance). However, the material of the first and second pixel electrodes PE1 and PE2, the first and second connection electrodes CTE1 and CTE2, and the intermediate electrode CSE is not limited to the above-described embodiment. According to one or more embodiments, the first and second pixel electrodes PE1 and PE2, the first and second connection electrodes CTE1 and CTE2, and the intermediate electrode CSE may be formed of various opaque conductive materials (or substances). The first pixel electrode PE1, the second pixel electrode PE2, and the intermediate electrode CSE may be formed as a single layer or multiple layers.

In one or more embodiments, a color conversion layer CCL may be disposed on the third insulating layer INS3. The color conversion layer CCL may change or transmit a wavelength of the light provided from the first to fourth light emitting elements LD1, LD2, LD3, and LD4. In an example, the first to fourth light emitting elements LD1, LD2, LD3, and LD4 may emit blue light.

In one or more embodiments, when the pixel PXL is a red pixel, a wavelength conversion pattern WCP of the color conversion layer CCL may include first color conversion particles (for example, quantum dots) that convert the blue light into red light. The first color conversion particle may absorb the blue light and shift a wavelength according to energy transition to emit the red light.

In one or more embodiments, when the pixel PXL is a green pixel, the wavelength conversion pattern WCP of the color conversion layer CCL may include second color conversion particles (for example, quantum dots) that convert the blue light into green light. The second color conversion particle may absorb the blue light and shift the wavelength according to energy transition to emit the green light.

In one or more embodiments, the color conversion particles may have a shape of a spherical, pyramidal, multi-arm, or cubic nanoparticle, nanotube, nanowire, nanofiber, nanoplate particle, or the like, but the present disclosure is not limited thereto.

In one or more embodiments, when the pixel PXL is a blue pixel, the color conversion layer CCL may include a light transmission pattern other than the wavelength conversion pattern WCP. The light transmission pattern is for efficiently using the light emitted from the first to fourth light emitting elements LD1, LD2, LD3, and LD4, and may include a plurality of light scattering particles dispersed in a suitable matrix material (e.g., a predetermined matrix material) such as a base resin. For example, the light transmission pattern may include light scattering particles such as silica, but a configuration material of the light scattering particles is not limited thereto.

In one or more embodiments, an optical layer OPL may be disposed on the display element layer DPL. According to one or more embodiments, the optical layer OPL may include a first capping layer CAP1, a low refraction layer LRL, and a second capping layer CAP2.

In one or more embodiments, the first capping layer CAP1 may seal (or cover) the color conversion layer CCL. The first capping layer CAP1 may be disposed between the low refraction layer LRL and the display element layer DPL. The first capping layer CAP1 may prevent permeation of an impurity such as moisture or air from the outside. For example, the first capping layer CAP1 may include one or more selected from among silicon nitride ($SiN_x$), silicon oxide ($SiO_x$), silicon oxynitride ($SiO_xN_y$), and aluminum oxide ($AlO_x$).

In one or more embodiments, the low refraction layer LRL may be disposed between the first capping layer CAP1 and the second capping layer CAP2. The low refraction layer LRL may improve light efficiency by recycling light provided from the color conversion layer CCL. To this end, the low refraction layer LRL may have a refractive index lower than that of the color conversion layer CCL. In an example, the low refraction layer LRL may include a base resin and a hollow particle dispersed in the base resin. The hollow particles may include a hollow silica particle. Alternatively, the hollow particle may be a pore formed by porogen, but is not limited thereto. In addition, the low refraction layer LRL may include one or more selected from among zinc oxide (ZnOx), titanium oxide ($TiO_x$), and nano silicate particles, but is not limited thereto.

In one or more embodiments, the second capping layer CAP2 may be disposed on the low refraction layer LRL. The second capping layer CAP2 may prevent permeation of an impurity such as moisture or air from the outside. The second capping layer CAP2 may include one or more selected from among silicon nitride (SiNx), silicon oxide (SiOx), silicon oxynitride (SiOxNy), and aluminum oxide (AlOx).

In one or more embodiments, a color filter layer CFL may be disposed on the second capping layer CAP2. The color filter layer CFL may include color filters CF and an overcoat layer OC.

In one or more embodiment, a first color filter CF1, a second color filter CF2, and a third color filter CF3 may be sequentially stacked in the non-emission area NEA.

In one or more embodiments, the overcoat layer OC may be disposed on the color filters CF. The overcoat layer OC may prevent moisture or air from permeating into a lower member. In addition, the overcoat layer OC may protect the above-described lower member from a foreign substance such as dust. In an example, the overcoat layer OC may include an organic material such as acrylate resin, epoxy resin, phenol resin, polyamide resin, polyimide resin, polyesters resin, polyphenylenesulfide resin, or benzocyclobutene (BCB). However, the present disclosure is not limited to the above-described example.

Figure 7B:
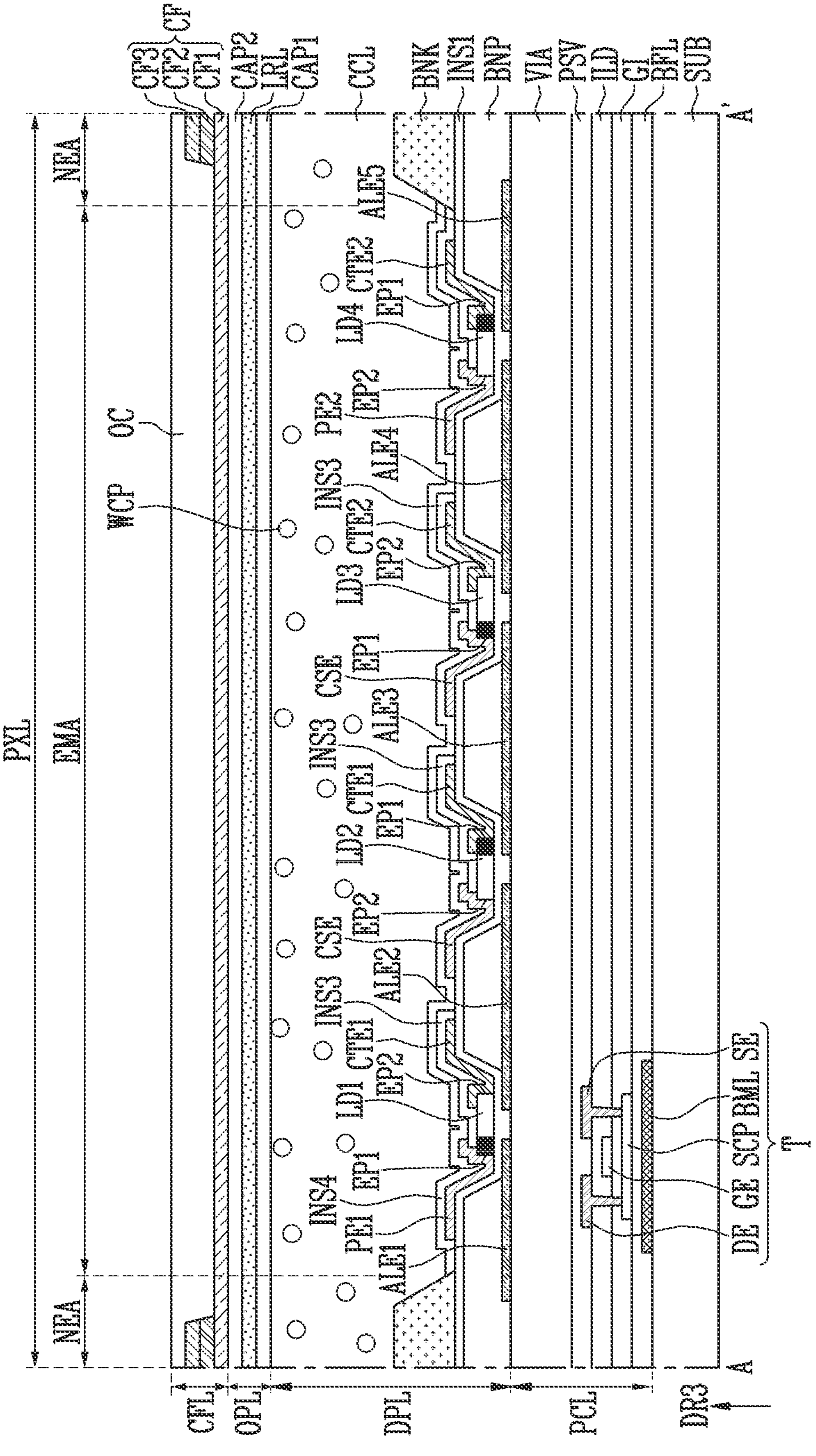
FIG. 7B is a schematic cross-sectional view illustrating another example taken along the line A-A' of FIG. 5B.

FIG. 7B is a schematic cross-sectional view illustrating another example taken along the line A-A' of FIG. 5B.

Referring to FIG. 7B, configurations except for configurations of the first to fifth alignment electrodes ALE1, ALE2, ALE3, ALE4, and ALE5 and the second insulating layer INS2 shown in FIG. 7A may be the same as the configurations shown in FIG. 7A, the same reference numerals are used for corresponding components, and an overlapping description is omitted.

Referring to FIG. 7B, the first to fifth alignment electrodes ALE1, ALE2, ALE3, ALE4, and ALE5 may be disposed to be spaced from each other on the via layer VIA. The bank pattern BNP may be disposed on the first to fifth alignment electrodes ALE1, ALE2, ALE3, ALE4, and ALE5.

In one or more embodiments, the first insulating layer INS1 may be entirely disposed on the bank pattern BNP. The first insulating layer INS1 may be disposed along a profile (or a shape) of the bank pattern BNP.

In one or more embodiments, the first and second pixel electrodes PE1 and PE2, the first and second connection electrodes CTE1 and CTE2, the intermediate electrode CSE, and the third and fourth insulating layers INS3 and INS4 may be formed on the first insulating layer INS1 and the first to fourth light emitting elements LD1, LD2, LD3, and LD4.

In one or more embodiments, the third insulating layer INS3 may be formed to cover the first to fourth light emitting elements LD1, LD2, LD3, and LD4 and the first and second connection electrodes CTE1 and CTE2. The fourth insulating layer INS4 may be formed in the emission area EMA to cover the third insulating layer INS3, the first and second pixel electrodes PE1 and PE2, and the intermediate electrode CSE.

Figure 8:
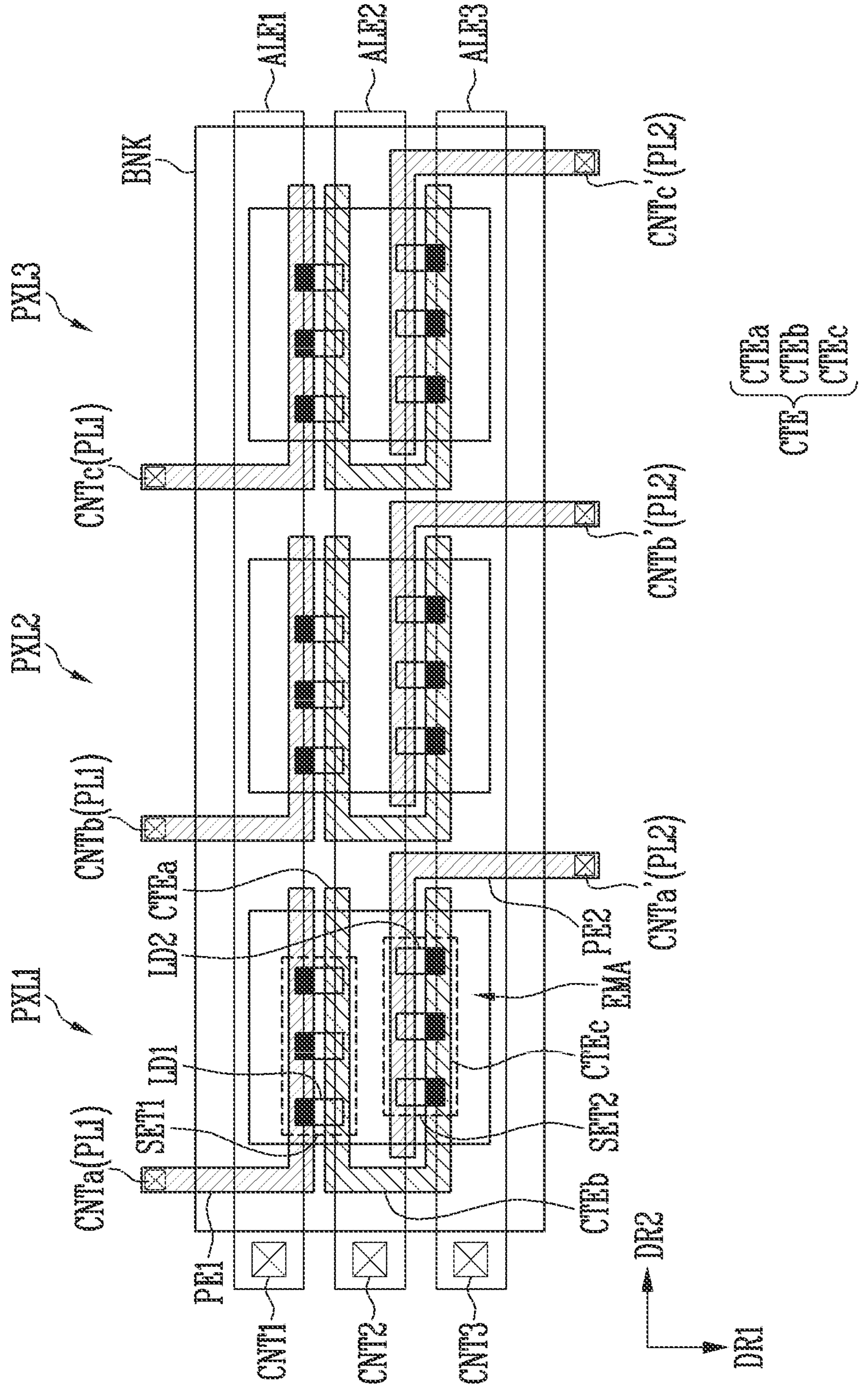
FIGS. 8 and 9 are schematic plan views illustrating other examples of the pixels included in the display device of FIG. 3.
Figure 9:
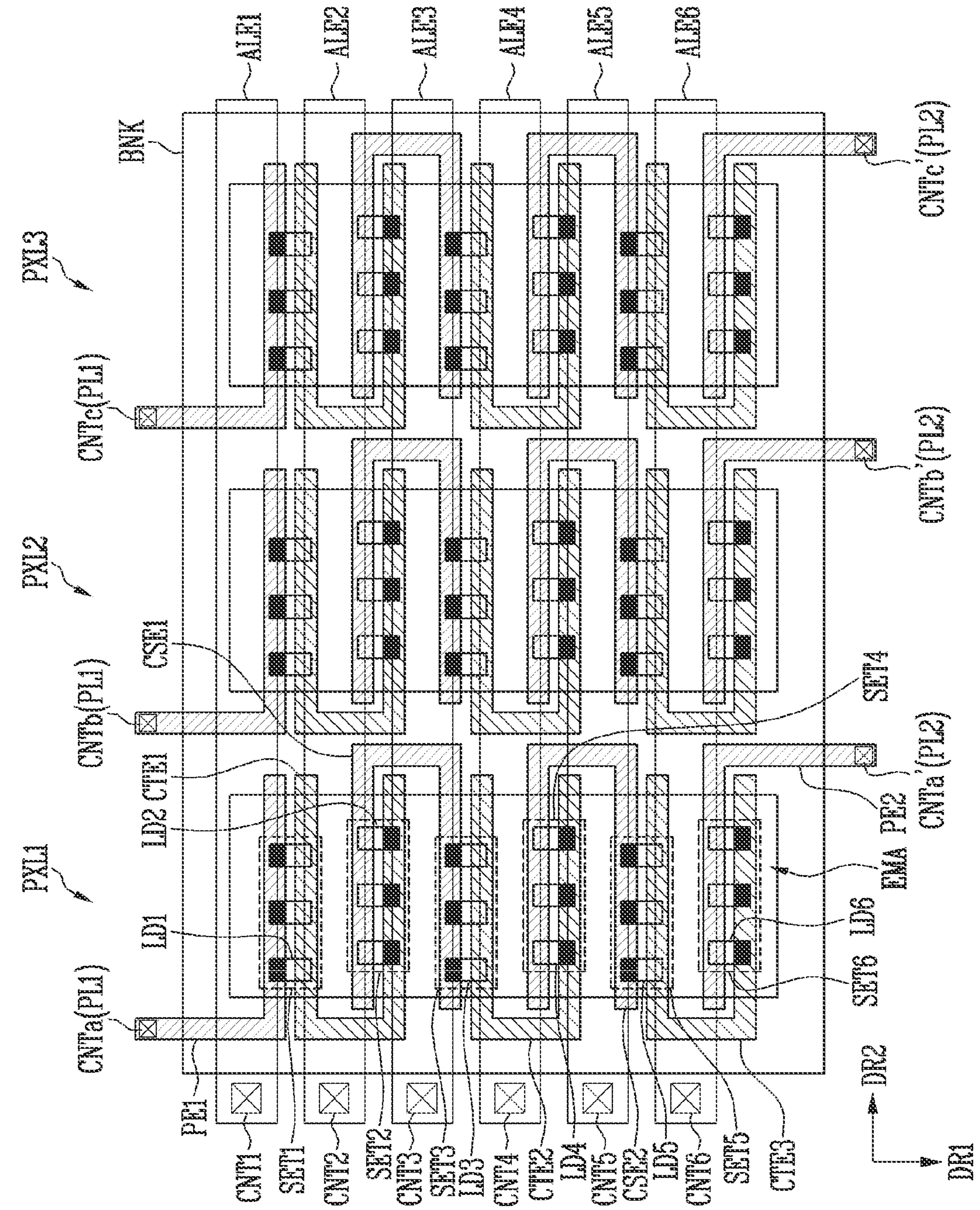

FIGS. 8 and 9 are schematic plan views illustrating other examples of the pixels included in the display device of FIG. 3.

In order to avoid a description overlapping that of FIG. 5B, a feature different from that of the above-described embodiment is mainly described.

FIG. 8 illustrates the pixel configured of the two series stages including the first series stage SET1 and the second series stage SET2 between the first power line PL1 and the second power line PL2.

Referring to FIG. 8, the display device may include the bank BNK, the alignment electrodes ALE1 to ALE3, the light emitting elements LD1 and LD2, the pixel electrodes PE1 and PE2, and the connection electrode CTE to configure the pixels PXL1, PXL2, and PXL3.

As shown in FIG. 8, the emission areas EMA of each of the first pixel PXL1, the second pixel PXL2, and the third pixel PXL3 may include the two series stages SET1 and SET2.

In one or more embodiments, the first pixel PXL1, the second pixel PXL2, and the third pixel PXL3 may include the first to third alignment electrodes ALE1, ALE2, and ALE3. In an example, the first to third alignment electrodes ALE1, ALE2, and ALE3 may be sequentially arranged to be spaced from each other in the first direction DR1, and may extend in the second direction DR2.

In one or more embodiments, the first alignment signal may be applied to the first alignment electrode ALE1 and the third alignment electrode ALE3. The second alignment signal may be applied to the second alignment electrode ALE2.

In an example, an electric field may be formed between (or on) the first alignment electrode ALE1 and the second alignment electrode ALE2, and the first light emitting elements LD1 may be aligned on (or between) the first alignment electrode ALE1 and the second alignment electrode ALE2 based on the electric field. An electric field may be formed between (or on) the second alignment electrode ALE2 and the third alignment electrode ALE3, and the second light emitting elements LD2 may be aligned on (or between) the second alignment electrode ALE2 and the third alignment electrode ALE3 based on the electric field.

In one or more embodiments, the first pixel electrode PE1, the connection electrode CTE, and the second pixel electrode PE2 may be sequentially disposed on the first to third alignment electrodes ALE1, ALE2, and ALE3.

In one or more embodiments, the connection electrode CTE may be disposed to be spaced in the first direction DR1 of the first pixel electrode PE1. The connection electrode CTE may have a shape bent at least once to surround one side of the second pixel electrode PE2.

In one or more embodiments, the connection electrode CTE may include a first portion CTEa, a second portion CTEb, and a third portion CTEc. In an example, the first portion CTEa of the connection electrode CTE may be disposed in the first direction DR1 of the first light emitting elements LD1 to be in contact with the second end of the first light emitting elements LD1. The third portion CTEc of the connection electrode CTE may be disposed in the first direction DR1 of the second light emitting elements LD2 to be in contact with the first end of the second light emitting elements LD2. The second portion CTEb of the connection electrode CTE may connect the first portion CTEa and the third portion CTEc, and may be integrally formed with the first portion CTEa and the third portion CTEc.

In one or more embodiments, the first light emitting elements LD1 connected in parallel between the first pixel electrode PE1 and the first portion CTEa of the connection electrode CTE may configure the first series stage SET1.

In one or more embodiments, the second light emitting elements LD2 connected in parallel between the second pixel electrode PE2 and the third portion CTEc of the connection electrode CTE may configure the second series stage SET2.

In one or more embodiments, the connection electrode CTE may be disposed in the first direction DR1 of the first light emitting elements LD1 and the second light emitting elements LD2 of the respective first series stage SET1 and second series stage SET2.

In one or more embodiments, the first light emitting elements LD1 and the second light emitting elements LD2 may be electrically connected through the connection electrode CTE.

In one or more embodiments, the first pixel electrode PE1 may be connected to the first driving power VDD through the first power line PL1 connected to the contact hole CNTa, and thus the driving current may flow to the first light emitting elements LD1, the connection electrode CTE, the second light emitting elements LD2, and the second pixel electrode PE2 during each frame period. The second pixel electrode PE2 may be connected to the second driving power VSS through the second power line PL2 connected to the contact hole CNTa'.

FIG. 9 illustrates a pixel configured of six series stages including first to six series stages SET1 to SET6 between the first power line PL1 and the second power line PL2.

Referring to FIG. 9, the display device may include a bank BNK, alignment electrodes ALE1 to ALE6, light emitting elements LD1, LD2, LD3, LD4, LD5, and LD6, connection electrodes CTE1, CTE2, and CTE3, and intermediate electrodes CSE1 and CSE2 to configure the pixels PXL1, PXL2, and PXL3.

In one or more embodiments, the first pixel PXL1, the second pixel PXL2, and the third pixel PXL3 may include first to sixth alignment electrodes ALE1, ALE2, ALE3, ALE4, ALE5, and ALE6. In an example, the first to sixth alignment electrodes ALE1, ALE2, ALE3, ALE4, ALE5, and ALE6 may be sequentially arranged spaced from each other in the first direction DR1 and may extend in the second direction DR2.

In one or more embodiments, the first alignment signal may be applied to the first alignment electrode ALE1, the third alignment electrode ALE3, and the fifth alignment electrode ALE5. The second alignment signal may be applied to the second alignment electrode ALE2, the fourth alignment electrode ALE4, and the sixth alignment electrode ALE6.

In one or more embodiments, first to third connection electrodes CTE1, CTE2, and CTE3 and first and second intermediate electrodes CSE1 and CSE2 may be disposed between the first and second pixel electrodes PE1 and PE2.

In one or more embodiments, the first pixel electrode PE1, the first connection electrode CTE1, the first intermediate electrode CSE1, the second connection electrode CTE2, the second intermediate electrode CSE2, the third connection electrode CTE3, and the second pixel electrode PE2 may be sequentially disposed on the first to sixth alignment electrodes ALE, ALE2, ALE3, ALE4, ALE5, and ALE6.

In one or more embodiments, when the pixel is configured with the six series stages, the connection electrode CTE may include the first connection electrode CTE1, the second connection electrode CTE2, and the third connection electrode CTE3. The intermediate electrode CSE may include the first intermediate electrode CSE1 and the second intermediate electrode CSE2.

In one or more embodiments, the first connection electrode CTE1 and the first intermediate electrode CSE1 may be disposed to alternate each other in the first direction DR1. The second connection electrode CTE2 and the second intermediate electrode CSE2 may be disposed to alternate each other in the first direction DR1.

In one or more embodiments, the first light emitting elements LD1 connected in parallel between the first pixel electrode PE1 and the first connection electrode CTE1 may configure the first series stage SET1 of the light emitting unit (for example, the light emitting unit EMU of FIG. 4). In an example, first ends of the first light emitting elements LD1 may be connected to the first pixel electrode PE1, and second ends of the first light emitting elements LD1 may be connected to the first connection electrode CTE1.

In one or more embodiments, the second light emitting elements LD2 connected in parallel between the first connection electrode CTE1 and the first intermediate electrode CSE1 may configure the second series stage SET2 of the light emitting unit EMU. In an example, first ends of the second light emitting elements LD2 may be connected to the first connection electrode CTE1, and second ends of the second light emitting elements LD2 may be connected to the first intermediate electrode CSE1.

In one or more embodiments, the third light emitting elements LD3 connected in parallel between the first intermediate electrode CSE1 and the second connection electrode CTE2 may configure the third series stage SET3 of the light emitting unit EMU. In an example, first ends of the third light emitting elements LD3 may be connected to the first intermediate electrode CSE1, and second ends of the third light emitting elements LD3 may be connected to the second connection electrode CTE2.

In one or more embodiments, the fourth light emitting elements LD4 connected in parallel between the second intermediate electrode CSE2 and the second connection electrode CTE2 may configure the fourth series stage SET4 of the light emitting unit EMU. In an example, first ends of the fourth light emitting elements LD4 may be connected to the second connection electrode CTE2, and second ends of the fourth light emitting elements LD4 may be connected to the second intermediate electrode CSE2.

In one or more embodiments, the fifth light emitting elements LD5 connected in parallel between the second intermediate electrode CSE2 and the third connection electrode CTE3 may configure the fifth series stage SET5 of the light emitting unit EMU. In an example, first ends of the fifth light emitting elements LD5 may be connected to the second intermediate electrode CSE2, and seconds end of the fifth light emitting elements LD5 may be connected to the third connection electrode CTE3.

In one or more embodiments, the sixth light emitting elements LD6 connected in parallel between the third connection electrode CTE3 and the second pixel electrode PE2 may configure the sixth series stage SET6 of the light emitting unit EMU. In an example, first ends of the sixth light emitting elements LD6 may be connected to the third connection electrode CTE3, and second ends of the sixth light emitting elements LD6 may be connected to the second pixel electrode PE2.

In one or more embodiments, the first ends of the first light emitting elements LD1, the third light emitting elements LD3, and the fifth light emitting elements LD5 may be disposed to face the direction opposite to the first direction DR1, but the first ends of the second light emitting elements LD2, the fourth light emitting elements LD4, and the sixth light emitting elements LD6 may be disposed to face the first direction DR1.

In one or more embodiments, the first connection electrode CTE1 may be disposed in the first direction DR1 of the first and second light emitting elements LD1 and LD2 to directly contact the first and second light emitting elements LD1 and LD2. The first and second light emitting elements LD1 and LD2 may be electrically connected through the first connection electrode CTE1.

In one or more embodiments, the first intermediate electrode CSE1 may be disposed in the direction opposite to the first direction DR1 of the second and third light emitting elements LD2 and LD3 to directly contact the second and third light emitting elements LD2 and LD3. The second and third light emitting elements LD2 and LD3 may be electrically connected to each other through the first intermediate electrode CSE1.

In one or more embodiments, the second connection electrode CTE2 may be disposed in the first direction DR1 of the third and fourth light emitting elements LD3 and LD4 to directly contact the third and fourth light emitting elements LD3 and LD4. The third and fourth light emitting elements LD3 and LD4 may be electrically connected to each other through the second connection electrode CTE2.

In one or more embodiments, the second intermediate electrode CSE2 may be disposed in the direction opposite to the first direction DR1 of the fourth and fifth light emitting elements LD4 and LD5 to directly contact the fourth and fifth light emitting elements LD4 and LD5. The fourth and fifth light emitting elements LD4 and LD5 may be electrically connected to each other through the second intermediate electrode CSE2.

In one or more embodiments, the third connection electrode CTE3 may be disposed in the first direction DR1 of the fifth and sixth light emitting elements LD5 and LD6 to directly contact the fifth and sixth light emitting elements LD5 and LD6. The fifth and sixth light emitting elements LD5 and LD6 may be electrically connected to each other through the third connection electrode CTE3.

In one or more embodiments, the first and second pixel electrodes PE1 and PE2 and the first and second intermediate electrodes CSE1 and CSE2 may be disposed in one direction of the first to sixth light emitting elements LD1, LD2, LD3, LD4, LD5, and LD6 to contact the first to sixth light emitting elements LD1, LD2, LD3, LD4, LD5, and LD6.

In one or more embodiments, the first to third connection electrodes CTE1, CTE2, and CTE3 may be disposed in another direction of the first to sixth light emitting elements LD1, LD2, LD3, LD4, LD5, and LD6 to contact the first to the sixth light emitting elements LD1, LD2, LD3, LD4, LD5, and LD6.

In one or more embodiments, the first pixel electrode PE1 may be connected to the first driving power VDD through the first power line PL1 connected to the contact hole CNTa, and thus the driving current may flow to the first light emitting elements LD1, the first connection electrode CTE1, the second light emitting elements LD2, the first intermediate electrode CSE1, the third light emitting elements LD3, the second connection electrode CTE2, the fourth light emitting elements LD4, the second intermediate electrode CSE2, the fifth light emitting elements LD5, the third connection electrode CTE3, the sixth light emitting elements LD6, and the second pixel electrode PE2. The second pixel electrode PE2 may be connected to the second driving power VSS through the second power line PL2 connected to the contact hole CNTa'.

Referring to FIGS. 5B, 8, and 9, the light emitting elements (for example, the light emitting elements LD of FIG. 4) may be electrically connected from the first pixel electrode PE1 to the second pixel electrode PE2 through the connection electrode CTE and the intermediate electrode CSE. When the pixel PXL is configured of four or more series stages, the connection electrode CTE and the intermediate electrode CSE may be disposed to sequentially alternate each other in one direction. For example, the connection electrode CTE may be disposed in one direction of the light emitting elements LD, and the first and second pixel electrodes PE1 and PE2 and the intermediate electrode CSE may be disposed in a direction opposite to the one direction of the light emitting element LD, in which the connection electrode CTE is disposed. As electrodes are sequentially disposed in one direction, an electrical short of electrodes caused by disposing electrodes in various directions may be improved and/or prevented. In addition, in a process of manufacturing the pixels PXL in multiple series, because the electrodes are disposed to alternate each other, a space margin may be secured, and thus process efficiency may be secured.

Hereinafter, the pixel having the four series structure (for example, the first to fourth series stages SET1, SET2, SET3, and SET4) is described with reference to FIGS. 10A to 12B.

Figure 10A:
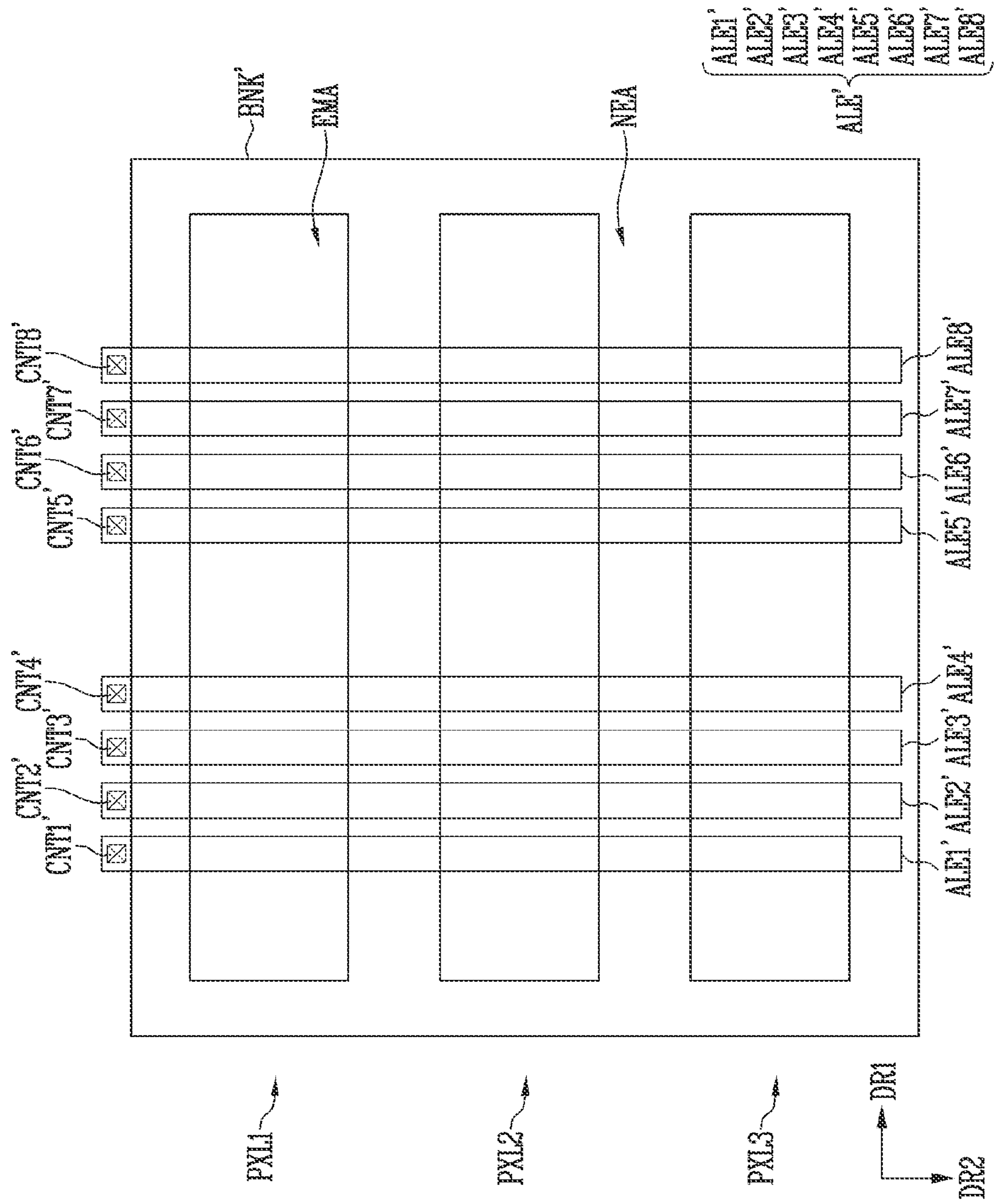
FIG. 10A is a schematic plan view illustrating an example of a bank partitioning the pixels included in the display device of FIG. 3, and alignment electrodes.
Figure 10B:
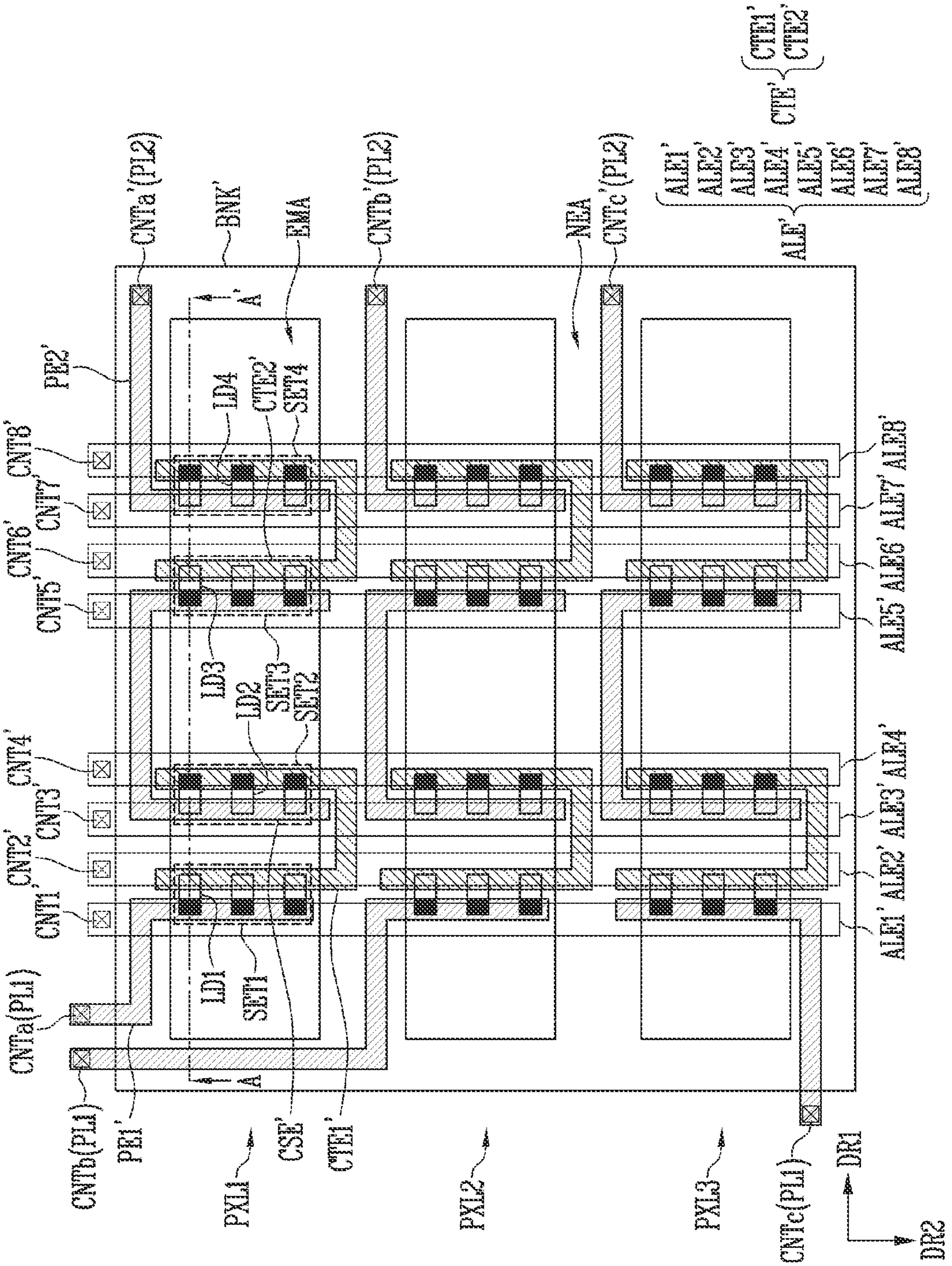
FIG. 10B is a schematic plan view illustrating an example of the pixels included in the display device of FIG. 3.

FIG. 10A is a schematic plan view illustrating an example of a bank partitioning the pixels included in the display device of FIG. 3, and alignment electrodes. FIG. 10B is a schematic plan view illustrating an example of the pixels included in the display device of FIG. 3.

FIG. 10A is a diagram for describing the bank BNK' for describing the emission area EMA and the non-emission area NEA of the pixels PXL1, PXL2, and PXL3 and the alignment electrodes ALE' for applying an alignment signal to the light emitting elements.

FIG. 10B is a diagram for describing some configurations included in the pixels PXL1, PXL2, and PXL3 based on the bank BNK' and the alignment electrodes ALE' of FIG. 10A.

In order to avoid a descriptions overlapping that of FIGS. 5A and 5B, a feature different from that of the above-described embodiment is mainly described.

Referring to FIGS. 10A and 10B, the display device may include the bank BNK', alignment electrodes ALE1' to ALE5', the light emitting elements LD1 to LD4, the pixel electrodes PE1' and PE2', the connection electrodes CTE1' and CTE2', and the intermediate electrode CSE'.

In one or more embodiments, the first pixel PXL1, the second pixel PXL2, and the third pixel PXL3 may be sequentially disposed to be spaced from each other in the second direction DR2.

Referring to FIG. 10A, the first pixel PXL1, the second pixel PXL2, and the third pixel PXL3 may include first to eighth alignment electrodes ALE1', ALE2', ALE3', ALE4', ALE5', ALE6', ALE7', and ALE8'. In an example, because the first to third pixels PXL1 to PXL3 share the first to eighth alignment electrodes ALE1', ALE2', ALE3', ALE4', ALE5', ALE6', ALE7', and ALE8', the description is based on the first pixel PXL1.

In one or more embodiments, the first to eighth alignment electrodes ALE1', ALE2', ALE3', ALE4', ALE5', ALE6', ALE7', and ALE8' may be sequentially arranged to be spaced from each other in along first direction DR1. In an example, the first to eighth alignment electrodes ALE1', ALE2', ALE3', ALE4', ALE5', ALE6', ALE7', and ALE8' may be disposed under the bank BNK'.

In one or more embodiments, the first to eighth alignment electrodes ALE1', ALE2', ALE3', ALE4', ALE5', ALE6', ALE7', and ALE8' may be electrodes for aligning the light emitting elements LD1, LD2, LD3, and LD4.

In one or more embodiments, each of the first to eighth alignment electrodes ALE1', ALE2', ALE3', ALE4', ALE5', ALE6', ALE7', and ALE8' may be an individual alignment electrode for aligning one light emitting element. For example, the first and second alignment electrodes ALE1' and ALE2' may be a pair of alignment electrodes for aligning the first light emitting elements LD1. The third alignment electrode ALE3' and the fourth alignment electrode ALE4' may be a pair of alignment electrodes for aligning the second light emitting elements LD2. The fifth alignment electrode ALE5' and the sixth alignment electrode ALE6' may be a pair of alignment electrodes for aligning the third light emitting elements LD3. The seventh alignment electrode ALE7' and the eighth alignment electrode ALE8' may be a pair of alignment electrodes for aligning the fourth light emitting elements LD4. In an example, the first alignment signal may be applied to one of the pair of alignment electrodes, and the second alignment signal may be applied to the other.

In one or more embodiments, the first alignment signal may be applied to the first alignment electrode ALE1', the third alignment electrode ALE3', the fifth alignment electrode ALE5', and the seventh alignment electrode ALE7'. The second alignment signal may be applied to the second alignment electrode ALE2', the fourth alignment electrode ALE4', the sixth alignment electrode ALE6', and the eighth alignment electrode ALE8'.

In one or more embodiments, an electric field may be formed between (or on) the first alignment electrode ALE1' and the second alignment electrode ALE2', and the first light emitting elements LD1 may be aligned on (or between) the first alignment electrode ALE1' and the second alignment electrode ALE2' based on the electric field.

In one or more embodiments, an electric field may be formed between (or on) the third alignment electrode ALE3' and the fourth alignment electrode ALE4', and the second light emitting elements LD2 may be aligned on (or between) the third alignment electrode ALE3' and the fourth alignment electrode ALE4' based on the electric field.

In one or more embodiments, an electric field may be formed between (or on) the fifth alignment electrode ALE5' and the sixth alignment electrode ALE6', and the third light emitting elements LD3 may be aligned on (or between) the fifth alignment electrode ALE5' and the sixth alignment electrode ALE6' based on the electric field.

In one or more embodiments, an electric field may be formed between (or on) the seventh alignment electrode ALE7' and the eighth alignment electrode ALE8', and the fourth light emitting elements LD4 may be aligned on (or between) the seventh alignment electrode ALE7' and the eighth alignment electrode ALE8' based on the electric field.

In another example, when the pixel is configured of two series stages, the first to fourth alignment electrodes ALE1', ALE2', ALE3', and ALE4' may be included. In this case, the pixel may include the first light emitting elements LD1 and second light emitting elements LD2. The first light emitting elements LD1 may be aligned on a pair of first alignment electrode ALE1' and second alignment electrode ALE2', and the second light emitting elements LD2 may be aligned on the other pair of third alignment electrode ALE3' and the fourth alignment electrode ALE4'.

In another example, when the pixel is configured of six series stages, first to twelfth alignment electrodes ALE1' to ALE12' may be included. In this case, the pixel may include first to sixth light emitting elements LD1 to LD6. The first to sixth light emitting elements LD1 to LD6 may be aligned on a plurality of alignment electrodes forming a pair.

Referring to FIG. 10B, the pixels PXL1, PXL2, and PXL3 may include a first pixel electrode PE1', a second pixel electrode PE2', a connection electrode CTE', and an intermediate electrode CSE'. Because the second pixel PXL2 and the third pixel PXL3 are substantially the same as the first pixel PXL1, the description is based on the first pixel PXL1.

In one or more embodiments, the first and second pixel electrodes PE1' and PE2', the connection electrode CTE', and the intermediate electrode CSE' may be disposed on the first to eighth alignment electrodes ALE1', ALE2', ALE3', ALE4', ALE5', ALE6', ALE7', and ALE5'.

In one or more embodiments, the first pixel electrode PE1', a first connection electrode CTE1', the intermediate electrode CSE', and a second connection electrode CTE2' may be sequentially arranged along the first direction DR1 in the emission area EMA.

In one or more embodiments, the first connection electrode CTE1', the second connection electrode CTE2', and the intermediate electrode CSE' may have a shape bent at least once.

In one or more embodiments, the first connection electrode CTE1' may be disposed to be spaced in the first direction DR1 of the first pixel electrode PE1'. The intermediate electrode CSE' may be disposed to be spaced in the first direction DR1 of the first connection electrode CTE1', and one area of the intermediate electrode CSE' may be disposed to overlap the first connection electrode CTE1'.

In one or more embodiments, the second connection electrode CTE2' may be disposed to be spaced in the first direction DR1 of the intermediate electrode CSE'. The second connection electrode CTE2' may be bent one or more times to surround the second pixel electrode PE2'.

In one or more embodiments, the first light emitting elements LD1 connected in parallel between the first pixel electrode PE1 and the first connection electrode CTE1' may configure the first series stage SET1 of the light emitting unit (for example, the light emitting unit EMU of FIG. 4).

In one or more embodiments, the second light emitting elements LD2 connected in parallel between the intermediate electrode CSE' and the first connection electrode CTE1' may configure the second series stage SET2 of the light emitting unit EMU.

In one or more embodiments, the third light emitting elements LD3 connected in parallel between the intermediate electrode CSE' and the second connection electrode CTE2' may configure the third series stage SET3 of the light emitting unit EMU.

In one or more embodiments, the fourth light emitting elements LD4 connected in parallel between the second pixel electrode PE2' and the second connection electrode CTE2' may configure the fourth series stage SET4 of the light emitting unit EMU.

In one or more embodiments, a disposition direction of the first end of the first light emitting elements LD1 and the first end of the third light emitting elements LD3 may be opposite to a disposition direction of the first end of the second light emitting elements LD2 and the first end of the fourth light emitting elements LD4.

Hereinafter, referring to FIG. 11, shapes of the first and second pixel electrodes PE1' and PE2', the first and second connection electrodes CTE1' and CTE2', and the intermediate electrode CSE' in relation to the alignment electrodes ALE' are described.

Figure 11:
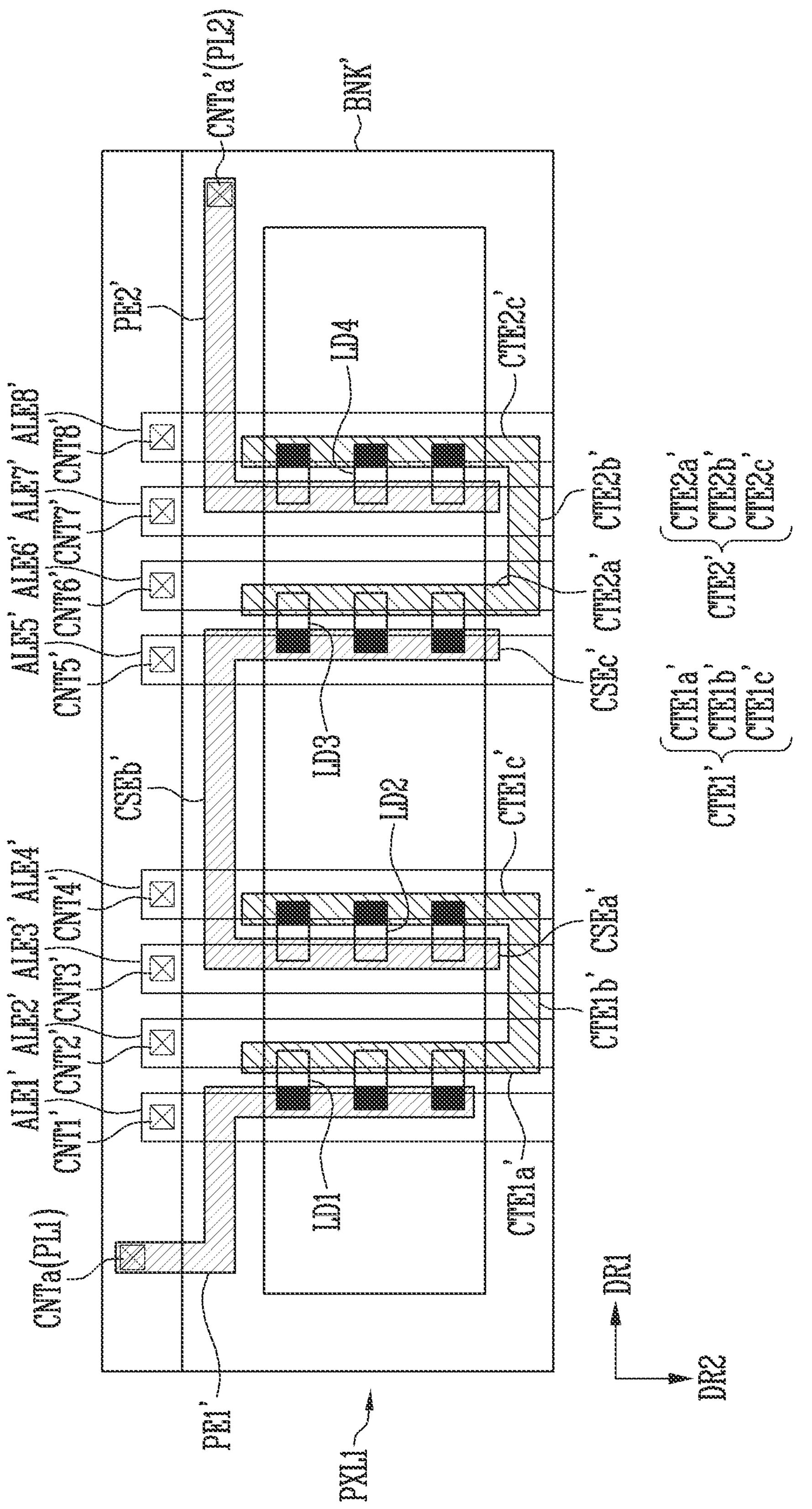
FIG. 11 is an enlarged view illustrating an example of the pixel of FIG. 10B.

FIG. 11 is an enlarged view illustrating an example of the pixel of FIG. 10B.

In one or more embodiments, the pixel PXL having the four series structure may include the first to eighth alignment electrodes ALE1', ALE2', ALE3', ALE4', ALE5', ALE6', ALE7', and ALE5', the first to fourth light emitting elements LD1, LD2, LD3, and LD4, the first and second pixel electrodes PE1' and PE2', the first and second connection electrodes CTE1' and CTE2'; and the intermediate electrode CSE'.

Referring to FIG. 11, the first connection electrode CTE1', the second connection electrode CTE2', and the intermediate electrode CSE' may have a shape bent at least once.

In one or more embodiments, the first connection electrode CTE1' may include a first portion CTE1*a*', a second portion CTE1*b*', and a third portion CTE1*c*'. The second connection electrode CTE2' may include a first portion CTE2*a*', a second portion CTE2*b*', and a third portion CTE2*c*'. The intermediate electrode CSE' may include a first portion CSEa', a second portion CSEb', and a third portion CSEc'.

In one or more embodiments, the first portion CTE1*a*' of the first connection electrode CTE1' may be disposed to overlap the second alignment electrode ALE2'. The third portion CTE1*c*' may be disposed to be spaced from the first portion CTE1*a*' in the first direction DR1 and to overlap the fourth alignment electrode ALE4'. The second portion CTE1*b*' may connect the first portion CTE1*a*' and the third portion CTE1*c*' and may be integrally formed with the first portion CTE1*a*' and the third portion CTE1*c*'.

In an example, the first portion CTE1*a*' of the first connection electrode CTE1' may be disposed in the first direction DR1 of the first light emitting elements LD1 to contact the second end of the first light emitting elements LD1. The third portion CTE1*c*' of the first connection electrode CTE1' may be disposed in the first direction DR1 of the second light emitting elements LD2 to contact the first end of the second light emitting elements LD2.

In one or more embodiments, the first portion CSEa' of the intermediate electrode CSE' may be disposed to overlap the third alignment electrode ALE3'. The third portion CSEc' may be disposed to be spaced from the first portion CSEa' in the first direction DR1 and to overlap the fifth alignment electrode ALE5'. The second portion CSEb' may connect the first portion CSEa' and the third portion CSEc', and may be integrally formed with the first portion CSEa' and the third portion CSEc'.

In one or more embodiments, the first portion CSEa' of the intermediate electrode CSE' may be disposed in the direction opposite to the first direction DR1 of the second light emitting elements LD2 to contact the second end of the second light emitting elements LD2. The third portion CESc' of the intermediate electrode CSE' may be disposed in the direction opposite to the first direction DR1 of the third light emitting elements LD3 to contact the first end of the third light emitting elements LD3.

In one or more embodiments, the first portion CTE2*a*' of the second connection electrode CTE2' may be disposed to overlap the sixth alignment electrode ALE6'. The third portion CTE2*c*' of the second connection electrode CTE2' may be spaced from the first portion CTE2*a*' in the first direction DR1 and may overlap the eighth alignment electrode ALE5'. The second portion CTE2*b*' may connect the first portion CTE2*a*' and the third portion CTE2*c*', and may be integrally formed with the first portion CTE2*a*' and the third portion CTE2*c*'.

In one or more embodiments, the first portion CTE2*a*' of the second connection electrode CTE2' may contact the second end of the third light emitting elements LD3. The third portion CTE2*c*' of the second connection electrode CTE2' may contact the first end of the fourth light emitting elements LD4.

In one or more embodiments, a shape of the first connection electrode CTE1' may be the same as that of the second connection electrode CTE2'.

In one or more embodiments, sizes, lengths, and shapes of the first connection electrode CTE1', the second connection electrode CTE2', and the intermediate electrode CSE' may be changed so that the pixel PXL corresponds to a size of the display device and a requirement condition on a manufacturing process of the display device. For example, the length of the intermediate electrode CSE' may be formed to be longer than that of the first connection electrode CTE1' and the second connection electrode CTE2'.

Referring to FIGS. 10B and 11, an arrangement direction of the light emitting elements of the pixels may be changed so that the light emitting element in the pixel satisfies a disposition of the alignment electrodes, the size of the display device, and the requirement condition (or a design conditions) on the manufacturing process.

Figure 12A:
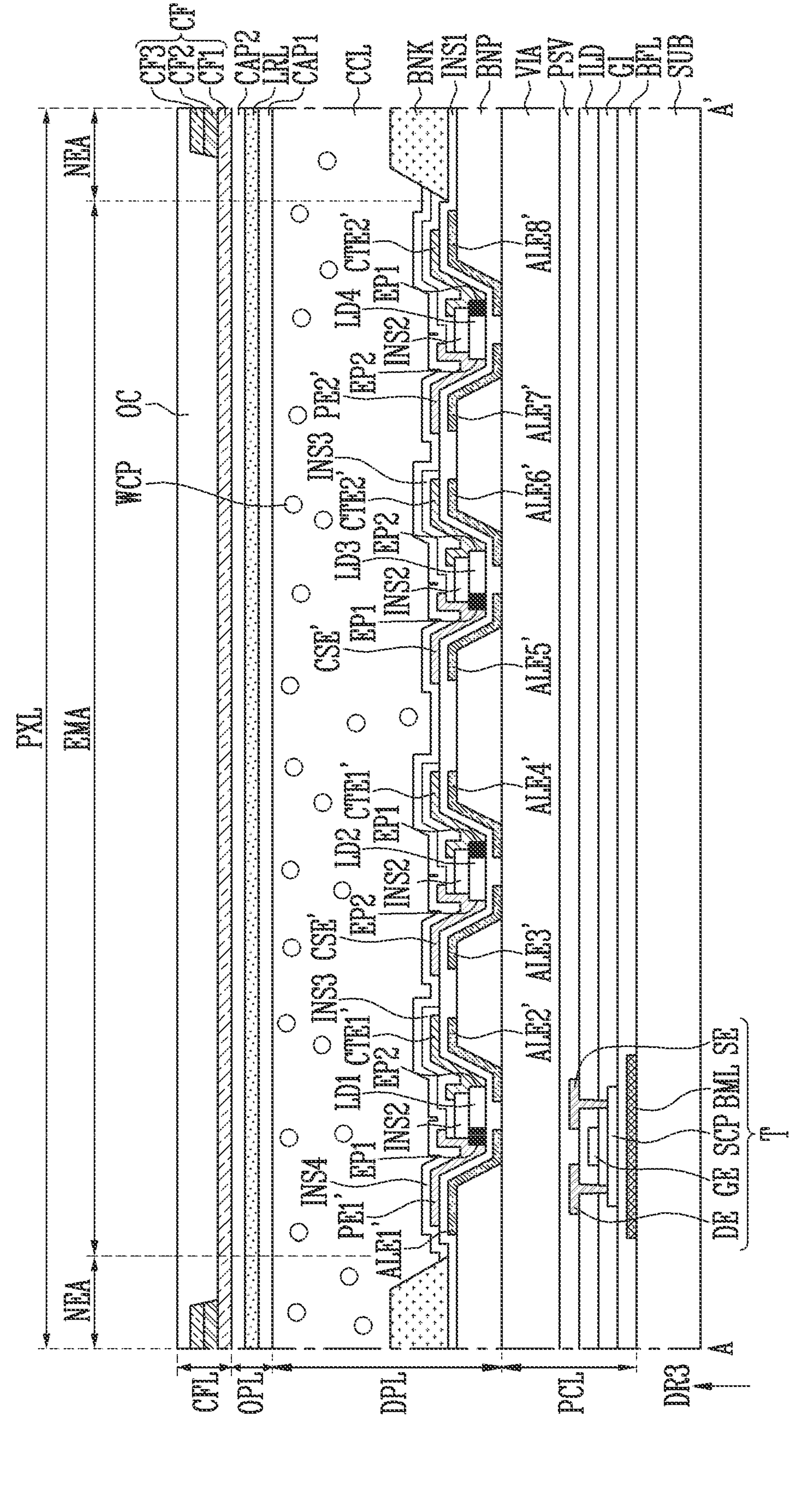
FIG. 12A is a schematic cross-sectional view illustrating an example taken along the line A-A' of FIG. 10B.
Figure 12B:
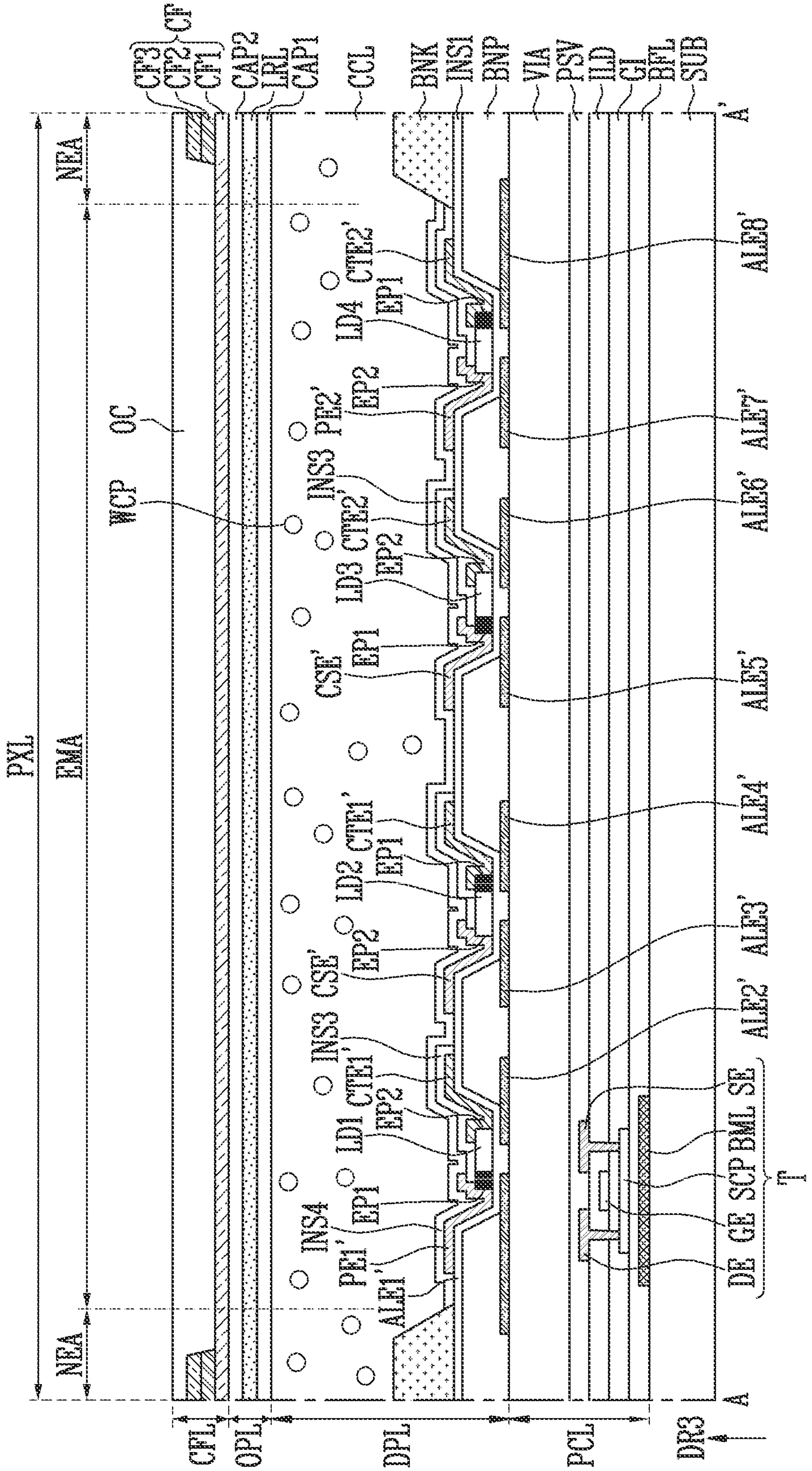
FIG. 12B is a schematic cross-sectional view illustrating another example taken along the line A-A' of FIG. 10B.

FIG. 12A is a schematic cross-sectional view illustrating an example taken along the line A-A' of FIG. 10B. FIG. 12B is a schematic cross-sectional view illustrating another example taken along the line A-A' of FIG. 10B.

In order to avoid a description overlapping that of FIG. 7A, a feature different from that of the above-described embodiment is mainly described.

Referring to FIG. 12A, the first to eighth alignment electrodes ALE1', ALE2', ALE3', ALE4', ALE5', ALE6', ALE7', and ALE8' may be provided and/or formed on the bank pattern BNP. In an example, one area of the first to eighth alignment electrodes ALE1', ALE2', ALE3', ALE4', ALE5', ALE6', ALE7', and ALE8' disposed on the bank pattern BNP may protrude in the third direction DR3 (or the thickness direction of the substrate SUB). In one or more embodiments, the first insulating layer INS1 may be entirely provided on the first to eighth alignment electrodes ALE1', ALE2', ALE3', ALE4', ALE5', ALE6', ALE7', and ALE8'.

Referring to FIG. 12B, the first to eighth alignment electrodes ALE1', ALE2', ALE3', ALE4', ALE5', ALE6', ALE7', and ALE8' may be disposed to be spaced from each other on the via layer VIA. The bank pattern BNP may be disposed on the first to eighth alignment electrodes ALE1', ALE2', ALE3', ALE4', ALE5', ALE6', ALE7', and ALE8'. In an example, the first insulating layer INS1 may be entirely disposed on the bank pattern BNP. The first insulating layer INS1 may be disposed along a profile (or a shape) of the bank pattern BNP.

Referring to FIGS. 12A and 12B, each distance between the first to fourth light emitting elements LD1, LD2, LD3, and LD4 in the pixel PXL may be designed differently. For example, a distance between the first light emitting elements LD1 and the second light emitting elements LD2 may be less than a distance between the second light emitting elements LD2 and the third light emitting elements LD3. The distance between the first light emitting elements LD1 and the second light emitting elements LD2 may be substantially the same as a distance between the third light emitting elements LD3 and the fourth light emitting elements LD4.

In one or more embodiments, shapes, lengths, and the like of the first and second pixel electrodes PE1 and PE2, the first and second connection electrodes CTE1 and CTE2, and the intermediate electrode CSE in the pixel PXL may be changed to correspond to a requirement condition (or a design condition) of the display device to which the pixel PXL is applied.

Although the present disclosure has been described with reference to the described embodiments thereof, those skilled in the art will understand that the present disclosure may be variously modified and changed without departing from the spirit and scope of the present disclosure disclosed in the following claims.

What is claimed is:

1. A display device comprising:

a substrate including an emission area and a non-emission area;

alignment electrodes spaced from each other along a first direction on the substrate and extending in a second direction crossing the first direction; and pixels arranged along the second direction, wherein pixels adjacent to each other in the second direction from among the pixels are configured to emit light of different colors, wherein each of the pixels comprises:

first light emitting elements on the alignment electrodes and arranged along the second direction;

second light emitting elements on the alignment electrodes, spaced from the first light emitting elements in the first direction, and arranged along the second direction;

a first pixel electrode electrically connected to a first driving power and first ends of the first light emitting elements;

a second pixel electrode spaced from the first pixel electrode in the first direction and electrically connected to a second driving power and second ends of the second light emitting elements; and a connection electrode electrically connecting the first pixel electrode and the second pixel electrode, wherein the connection electrode comprises:

a first connection electrode extending in the second direction between the first pixel electrode and the second pixel electrode and electrically connected to second ends of the first light emitting elements; and a second connection electrode extending in the second direction to face the first connection electrode with the second pixel electrode interposed therebetween and electrically connected to first ends of the second light emitting elements.

2. The display device according to claim 1, further comprising a third connection electrode connecting the first connection electrode and the second connection electrode, and extending in the first direction, wherein the first connection electrode, the second connection electrode, and the third connection electrode are integrally formed.

3. The display device according to claim 2, wherein the third connection electrode overlaps the non-emission area when viewed in a plan view.

4. The display device according to claim 2, wherein the alignment electrodes comprise a first alignment electrode, a second alignment electrode, and a third alignment electrode sequentially arranged along the first direction, wherein the first light emitting elements overlap the first alignment electrode and the second alignment electrode and located on the first alignment electrode and the second alignment electrode, and wherein the second light emitting elements overlap the second alignment electrode and the third alignment electrode and located on the second alignment electrode and the third alignment electrode.

5. The display device according to claim 2, wherein the alignment electrodes comprise a first alignment electrode, a second alignment electrode, a third alignment electrode, and a fourth alignment electrode sequentially arranged along the first direction, wherein the first light emitting elements overlap the first alignment electrode and the second alignment electrode and located on the first alignment electrode and the second alignment electrode, and wherein the second light emitting elements overlap the third alignment electrode and the fourth alignment electrode and located on the third alignment electrode and the fourth alignment electrode.

6. The display device according to claim 5, wherein the pixels comprise a first pixel, a second pixel, and a third pixel arranged along the second direction, wherein the first pixel electrode extends in the second direction in the emission area of each of the pixels, and wherein a first pixel electrode in the first pixel is spaced from a first pixel electrode in the second pixel and a first pixel electrode in the third pixel in the second direction.

7. The display device according to claim 6, wherein the second pixel electrode extends in the second direction in the emission area of each of the pixels, and a second pixel electrode in the first pixel is spaced from a second pixel electrode in the second pixel and a second pixel electrode in the third pixel in the second direction.

8. The display device according to claim 1, wherein the second connection electrode surrounds one area of the second pixel electrode.

9. The display device according to claim 8, further comprising:

third light emitting elements spaced from the first light emitting elements in the first direction and arranged along the second direction; and fourth light emitting elements spaced from the third light emitting elements in the first direction and arranged along the second direction, wherein the second light emitting elements are spaced in the first direction from the fourth light emitting elements.

10. The display device according to claim 9, wherein the first connection electrode comprises:

a first portion electrically connected to the second ends of the first light emitting elements;

a third portion electrically connected to the first ends of the second light emitting elements; and a second portion connecting the first portion and the third portion and extending in the first direction, and the first portion, the second portion, and the third portion are integrally formed.

11. The display device according to claim 10, wherein the second connection electrode comprises:

a first portion electrically connected to second ends of the third light emitting elements;

a third portion electrically connected to the first ends of the fourth light emitting elements; and a second portion connecting the first portion and the third portion and extending in the first direction, and the first portion, the second portion, and the third portion are integrally formed.

12. The display device according to claim 11, further comprising:

an intermediate electrode between the first connection electrode and the second connection electrode and electrically connected to second ends of the second light emitting elements and first ends of the third light emitting elements.

13. The display device according to claim 12, wherein the intermediate electrode comprises:

a first intermediate electrode electrically connected to the second ends of the second light emitting elements;

a third intermediate electrode electrically connected to the first ends of the third light emitting elements; and a second intermediate electrode connecting the first intermediate electrode and the third intermediate electrode and extending in the first direction, and the first intermediate electrode, the second intermediate electrode, and the third intermediate electrode are integrally formed.

14. The display device according to claim 13, wherein the second portion of the first connection electrode, the second portion of the second connection electrode, and the second intermediate electrode overlap the non-emission area when viewed in a plan view.

15. The display device according to claim 13, further comprising:

a bank defining the emission area and the non-emission area, wherein the second portion of the first connection electrode, the second portion of the second connection electrode, and the second intermediate electrode overlap the bank when viewed in a plan view.

16. The display device according to claim 13, wherein the first connection electrode, the intermediate electrode, and the second connection electrode are spaced from each other in the first direction, and the first intermediate electrode, the third portion of the first connection electrode, and the third intermediate electrode are alternately arranged along the first direction.

17. The display device according to claim 13, wherein a shape of the intermediate electrode is symmetrical with a shape of the first connection electrode and a shape of the second connection electrode with respect to the first direction.

18. The display device according to claim 13, wherein disposition directions of the first light emitting elements and the third light emitting elements are the same, and wherein a disposition direction of the second light emitting elements and the fourth light emitting element is opposite to the disposition direction of the first light emitting elements and the third light emitting elements.

19. The display device according to claim 13, wherein the alignment electrodes comprise a first alignment electrode, a second alignment electrode, a third alignment electrode, a fourth alignment electrode, and a fifth alignment electrode sequentially arranged along the first direction, wherein the first light emitting elements overlap the first alignment electrode and the second alignment electrode and are located on the first alignment electrode and the second alignment electrode, wherein the second light emitting elements overlap the second alignment electrode and the third alignment electrode and are located on the second alignment electrode and the third alignment electrode, wherein the third light emitting elements overlap the third alignment electrode and the fourth alignment electrode and are located on the third alignment electrode and the fourth alignment electrode, and wherein the fourth light emitting elements overlap the fourth alignment electrode and the fifth alignment electrode and are located on the fourth alignment electrode and the fifth alignment electrode.

20. The display device according to claim 13, wherein the alignment electrodes comprise a first alignment electrode, a second alignment electrode, a third alignment electrode, a fourth alignment electrode, a fifth alignment electrode, a sixth alignment electrode, a seventh alignment electrode, and an eighth alignment electrode sequentially arranged along the first direction, wherein the first light emitting elements overlap the first alignment electrode and the second alignment electrode and are located on the first alignment electrode and the second alignment electrode, wherein the second light emitting elements overlap the third alignment electrode and the fourth alignment electrode and are located on the third alignment electrode and the fourth alignment electrode, wherein the third light emitting elements overlap the fifth alignment electrode and the sixth alignment electrode and are located on the fifth alignment electrode and the sixth alignment electrode, and wherein the fourth light emitting elements overlap the seventh alignment electrode and the eighth alignment electrode and are located on the seventh alignment electrode and the eighth alignment electrode.

* * * * *